(12) United States Patent
Wada et al.

(10) Patent No.: US 8,759,123 B2
(45) Date of Patent: Jun. 24, 2014

(54) METHOD OF MANUFACTURING LED LAMP

(75) Inventors: Satoshi Wada, Aichi-ken (JP); Miki Moriyama, Aichi-ken (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 813 days.

(21) Appl. No.: 12/659,954

(22) Filed: Mar. 25, 2010

(65) Prior Publication Data
US 2010/0244071 A1  Sep. 30, 2010

(30) Foreign Application Priority Data

Mar. 26, 2009  (JP) ................................ 2009-076907
Sep. 3, 2009   (JP) ................................ 2009-204043
Dec. 28, 2009  (JP) ................................ 2009-298785

(51) Int. Cl.
H01L 21/00 (2006.01)

(52) U.S. Cl.
USPC ................................. 438/27; 438/26; 257/98

(58) Field of Classification Search
CPC ............................... H01L 33/52; H01L 33/48
USPC ......................................... 438/26, 27; 257/98
See application file for complete search history.

(56) References Cited

U.S. PATENT DOCUMENTS

| | | | |
|---|---|---|---|
| 6,335,548 B1 * | 1/2002 | Roberts et al. .................. 257/98 |
| 6,682,331 B1 * | 1/2004 | Peh et al. ....................... 425/112 |
| 6,756,610 B2 * | 6/2004 | Sakamoto et al. .............. 257/79 |
| 7,344,902 B2 * | 3/2008 | Basin et al. ..................... 438/27 |
| 7,348,203 B2 * | 3/2008 | Kaushal et al. ................. 438/64 |
| 7,446,343 B2 * | 11/2008 | Mueller et al. .................. 257/89 |
| 7,452,737 B2 * | 11/2008 | Basin et al. ..................... 438/27 |
| 7,476,909 B2 * | 1/2009 | Nagai et al. ..................... 257/94 |
| 7,496,270 B2 * | 2/2009 | Kim et al. ..................... 385/147 |
| 7,714,335 B2 * | 5/2010 | Beckers ......................... 257/88 |
| 7,750,358 B2 * | 7/2010 | Shiraishi et al. ............... 257/98 |
| 7,795,055 B2 * | 9/2010 | Lee et al. ........................ 438/29 |
| 7,812,363 B2 * | 10/2010 | Higashi ......................... 257/98 |
| 7,816,704 B2 * | 10/2010 | Hsu et al. ....................... 257/98 |
| 7,825,423 B2 * | 11/2010 | Shiraishi et al. ............... 257/98 |
| 7,858,408 B2 * | 12/2010 | Mueller et al. ................. 438/27 |
| 7,928,457 B2 * | 4/2011 | Kato et al. ..................... 257/98 |
| 8,093,609 B2 * | 1/2012 | Hand et al. ..................... 257/98 |
| 8,222,059 B2 * | 7/2012 | Ashida ........................... 438/28 |
| 8,330,176 B2 * | 12/2012 | Thompson et al. ............ 257/98 |
| 2002/0190262 A1 * | 12/2002 | Nitta et al. ..................... 257/99 |

(Continued)

FOREIGN PATENT DOCUMENTS

| | | |
|---|---|---|
| JP | 2004-207660 | 7/2004 |
| JP | 2008-49841 | 3/2008 |
| JP | 2008-124153 | 5/2008 |
| WO | WO 2004/082036 A1 | 9/2004 |

*Primary Examiner* — Kimberly Rizkallah
*Assistant Examiner* — Caleb Henry
(74) *Attorney, Agent, or Firm* — McGinn IP Law Group, PLLC

(57) ABSTRACT

A method of manufacturing a LED lamp that is formed by sealing a LED element mounted on a substrate with glass, includes a mounting process for mounting the LED element on the substrate, a sealing member preparation process for preparing a glass sealing member that includes a concave portion being capable of housing the LED element, and a sealing process wherein the sealing member is arranged so that a forming surface of the concave portion faces the LED element, the sealing member is bonded to the substrate by thermal compression bonding, and the forming surface of the concave portion is made along the LED element.

20 Claims, 27 Drawing Sheets

(56) References Cited

U.S. PATENT DOCUMENTS

| | | | |
|---|---|---|---|
| 2005/0062055 A1* | 3/2005 | Gallup et al. | 257/98 |
| 2005/0062056 A1* | 3/2005 | Baugh et al. | 257/98 |
| 2005/0161771 A1 | 7/2005 | Suehiro et al. | |
| 2005/0269587 A1* | 12/2005 | Loh et al. | 257/99 |
| 2005/0275079 A1* | 12/2005 | Stark | 257/680 |
| 2006/0091418 A1* | 5/2006 | Chew | 257/100 |
| 2006/0105485 A1* | 5/2006 | Basin et al. | 438/27 |
| 2006/0171152 A1* | 8/2006 | Suehiro et al. | 362/363 |
| 2006/0261364 A1* | 11/2006 | Suehiro et al. | 257/100 |
| 2008/0049436 A1 | 2/2008 | Yoshihara et al. | |
| 2008/0079182 A1* | 4/2008 | Thompson et al. | 264/1.9 |
| 2008/0144322 A1* | 6/2008 | Norfidathul et al. | 362/310 |
| 2008/0237617 A1* | 10/2008 | Itoh et al. | 257/98 |
| 2008/0283861 A1* | 11/2008 | Loh et al. | 257/98 |
| 2009/0065790 A1* | 3/2009 | Chitnis et al. | 257/88 |
| 2010/0276711 A1* | 11/2010 | Hand et al. | 257/98 |

* cited by examiner

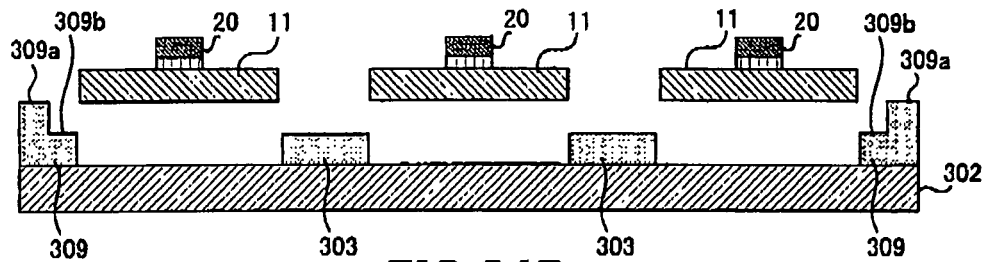
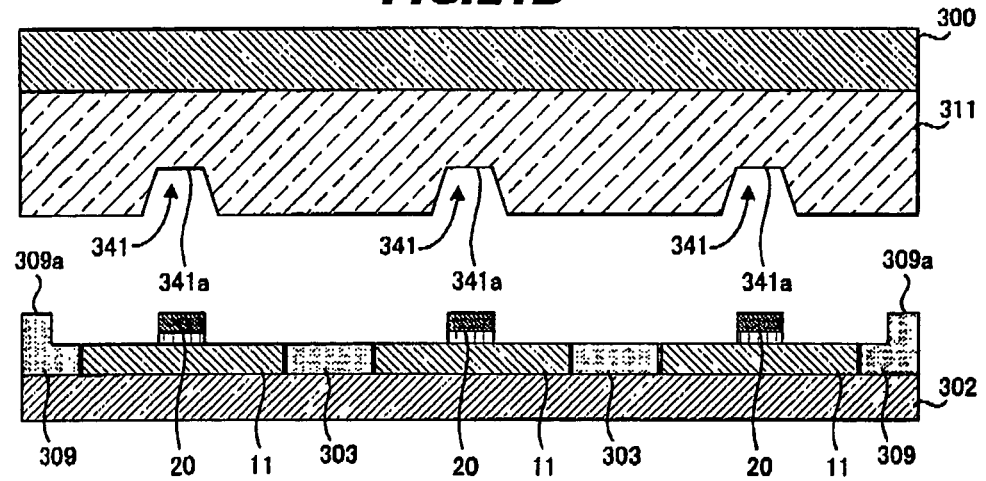
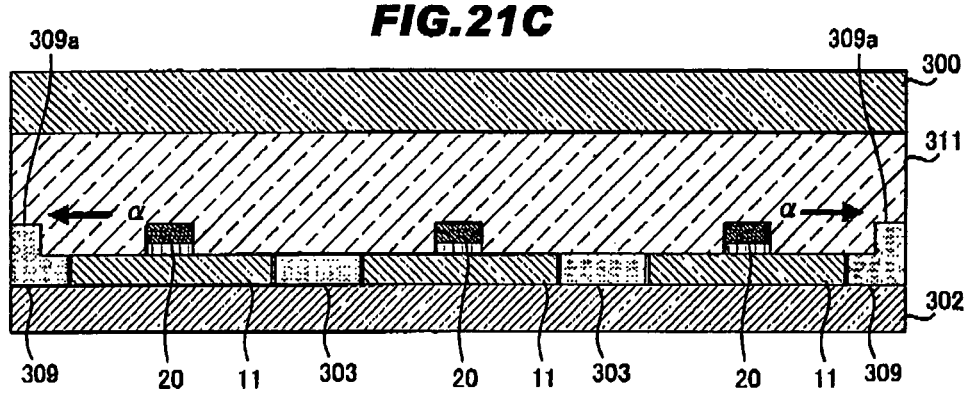
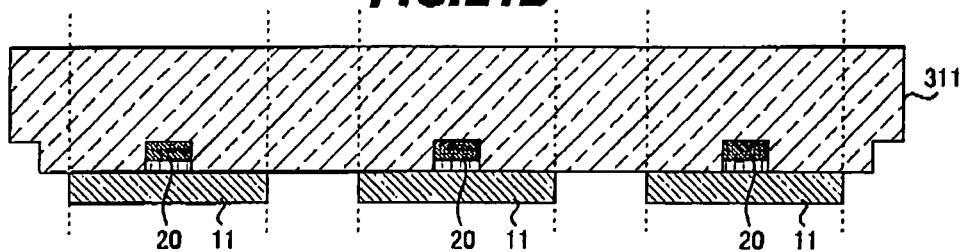

METHOD OF MANUFACTURING LED LAMP

The present application is based on Japanese Patent Application Nos. 2009-076907, 2009-204043 and 2009-298785 filed on Mar. 26, 2009, Sep. 3, 2009 and Dec. 28, 2009, respectively, the entire contents of which are incorporated herein by reference.

BACKGROUND OF THE INVENTION

1. Field of the Invention

The invention relates to a method of manufacturing a LED lamp.

2. Description of the Related Art

Conventionally, a method, in which a LED chip is sealed by pressing a plate glass softened by heat against a substrate having the LED chip thereon using a forming die, is broadly used as a method of sealing a LED chip with glass. A LED lamp sealed with glass by such a method is disclosed in WO 2004/082036 and JP 2008-124153. In addition, JP 2008-49841 discloses a method in which a concave portion for covering a LED chip is provided in a sealing glass in order to prevent the sealing glass from contacting with the LED chip, the LED chip is then covered by the sealing glass and a resin is injected between the LED chip and a forming surface of the concave portion.

According to the method of WO 2004/082036 and JP 2008-124153, it is necessary to seal the LED chip after softening the sealing glass by heating at a temperature much exceeding a yielding point and near softening point or higher, in light of the production tact required for a sealing process of the LED chip. However, the sealing glass softened by heating to the softening point or more adheres to not only a substrate but also to a forming die. Thus, it is considered that the adhesion of the sealing glass is prevented by roughening a surface of a die used for the sealing glass and decreasing a contact area of the sealing glass and the forming die. However, roughening the surface as described above is not preferable since surface accuracy of the LED lamp is reduced and light availability of the LED chip decreases. When the sealing glass is heated at a temperature lower than the softening temperature in order to avoid the above problem, the sealing glass is not sufficiently softened and an excessive force is then applied to the LED chip when the sealing glass is pressed against the substrate. This caused breakage or misalignment of the LED chip.

On the other hand, in the method of the JP 2008-49841, the LED chip is located in the concave portion of the sealing glass and is enclosed by a resin. The resin is not preferable since it is denatured and yellowed due to light or heat of the LED chip.

Therefore, one object of the invention is to provide a method of manufacturing a LED lamp in which misalignment or breakage of a LED chip is prevented. In addition, another object of the invention is to provide a method of manufacturing a LED lamp in which adhesion of a sealing glass to a forming die is prevented.

SUMMARY OF THE INVENTION

According to a first aspect of the invention, a method of manufacturing a LED lamp that is formed by sealing a LED element mounted on a substrate with glass, comprises:

a mounting process for mounting the LED element on the substrate;

a sealing member preparation process for preparing a glass sealing member that includes a concave portion being capable of housing the LED element; and a sealing process wherein the sealing member is arranged so that a forming surface of the concave portion faces the LED element, the sealing member is bonded to the substrate by thermal compression bonding, and the forming surface of the concave portion is made along the LED element.

According to the method of manufacturing a LED lamp of the invention, since a sealing member is bonded to a substrate by thermal compression in a sealing process so that a LED element is located in a concave portion of the sealing member, the LED element is prevented from being directly pressed when the sealing member is pressed against the substrate. As a result, breakage or misalignment of the LED element is prevented. In addition, since the concave portion is formed on the sealing member prior to the sealing process, it is not necessary to move a forming material of the sealing material equivalent to volume of the LED element in the sealing process, which would be necessary in case of deformation, etc., thus, it is possible to bond by thermal compression at a temperature lower than the conventional art. As described above, since the sealing member is not excessively softened by the thermal compression bonding at a low temperature, the sealing member is prevented from adhering to a forming die which presses the sealing member against the substrate. As a result, it is possible to smooth the surface of the sealing member by increasing the surface accuracy of the forming die and to form a further precise lens shape.

BRIEF DESCRIPTION OF THE DRAWINGS

Next, the present invention will be explained in more detail in conjunction with appended drawings, wherein:

FIG. 21 is a schematic vertical cross sectional view for illustrating manufacturing processes in a sixteenth embodiment of the invention;

DETAILED DESCRIPTION OF THE PREFERRED EMBODIMENTS

Figure 1:
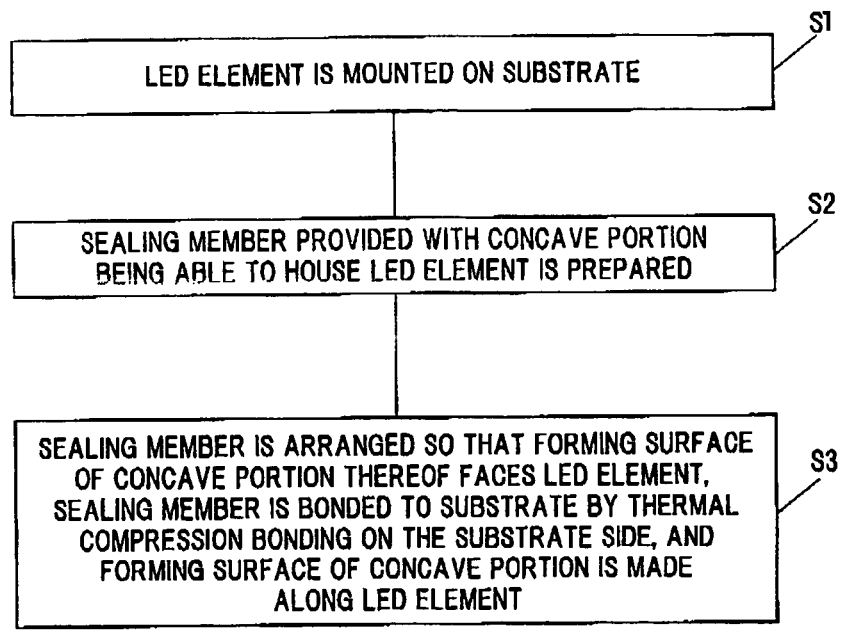
FIG. 1 is a flow diagram of a first embodiment of the present invention.

A first process of the method for manufacturing the LED lamp of the invention is a mounting process for mounting the LED element on a substrate. Ceramics, etc., such as aluminum nitride or alumina can be employed as a known material used here for a substrate, and specifically, it is preferable to employ aluminum nitride which is excellent in heat dissipation. In the first process, the LED element is mounted on the substrate via a metal bump such as gold (Au) or solder.

A second process of the method for manufacturing the LED lamp of the invention is a sealing member preparation process for preparing a sealing member provided with a concave portion being capable of housing the LED element.

The material of the sealing member is glass, and it is possible to use glass in which, for example, a small amount of alkali metal oxide such as lithium oxide ($LiO_2$) or sodium oxide ($Na_2O$) is added to a base glass consisting mainly of zinc oxide (ZnO) such as zinc oxide-boron oxide-silicon oxide-niobium oxide ($ZnO$—$B_2O_3$—$SiO_2$—$Nb_2O_5$) system or zinc oxide-boron oxide-silicon oxide-bismuth oxide ($ZnO$—$B_2O_3$—$SiO_2$—$Bi_2O_3$) system.

"Capable of housing a LED element" means that all surfaces of the LED element excluding a surface facing a substrate can be enclosed.

"A concave portion being capable of housing a LED element" indicates a concave portion (dent portion) of which forming surface can enclose all surfaces of the LED element excluding a surface facing a substrate. The concave portion as described above allows the LED elements to be arranged therein.

Thus, when the sealing member is pressed in the below-described sealing process, the sealing member is prevented from pressing the LED element, and it is possible to prevent the breakage or the misalignment of the LED element.

The shape of the concave portion is not specifically limited as long as it is possible to enclose the LED element as described above, however, a preferable shape is such that a forming surface of the concave portion does not contact with a surface of the LED element in a state prior to the sealing process. It is because the breakage or the misalignment of the LED element is further prevented in the sealing process.

The concave portion may be formed by using any methods (e.g., molding, cutting or etching, etc.). In case of the molding, a vertical cross sectional shape of the concave portion can be formed in a trapezoidal shape which expands toward the opening side in light of the ease of pulling out the forming die.

A third process of the method for manufacturing the LED lamp of the invention is a sealing process in which the sealing member is arranged so that a forming surface of the concave portion of the sealing member faces the LED element, the sealing member is bonded to the substrate by thermally compressing on the substrate side, and the forming surface of the concave portion is made along the LED element.

In the sealing process, a thermal compression bonding temperature (T (° C.)) may be set to, e.g., a temperature range of $Tg<T \leq Ap+30°$ C. where the glass-transition temperature of the sealing member is (Tg (° C.)) and the yielding point (breakdown point) temperature thereof is (Ap (° C.)), preferably $Tg<T \leq Ap+20°$ C., and more preferably $Tg<T \leq Ap$.

As described above, since the sealing member is not excessively softened by the thermal compression bonding in which T is set to a temperature about from Tg to Ap, the sealing member is prevented from adhering to the forming die at the time of sealing by pressing the sealing member against the substrate. As a result, it is possible to increase the surface accuracy of the forming die, which allows to smooth the surface of the sealing member and to transfer a microscopic concavo-convex shape of the non-spherical, micron-order or nano-order forming die, and it is thus possible to form a precise lens.

Alternatively, although the thermal compression bonding is conventionally performed by setting T to a softening point temperature (SP (° C.)), it is possible to perform the thermal compression bonding by adjusting T lower than SP. For example, as for a gallium nitride-based compound semiconductor ($Al_{1-X-Y}In_XGa_YN$, $0 \leq X \leq 1$, $0 \leq Y \leq 1$, $0 \leq X+Y \leq 1$) which is used as a blue LED chip, a maximum temperature during a semiconductor forming process is generally 700-800° C., and there is a possibility that the LED element is damaged by the sealing process at the higher temperature. Therefore, it is necessary to select a glass composition which allows the sealing process without damaging the LED element, thus, flexibility of selecting the sealing member is decreased. According to the method of the invention, since it is possible to keep T lower than the conventional sealing process, the flexibility of selecting the sealing member is increased.

In the sealing process, the forming surface of the concave portion of the sealing member is made along the LED element by the thermal compression bonding. In other words, the forming surface of the concave portion of the sealing member is deformed along the LED element by heating. Thus, since a gap between the sealing member and the LED element practically disappears, the LED element is optically connected to the sealing member.

In the meantime, in the second process (sealing member preparation process) and the third process (sealing process), the molding can be carried out in a chamber of a molding equipment under any of a vacuum atmosphere, reduced-pressure atmosphere or a normal temperature atmosphere.

Under the vacuum atmosphere, it is possible to prevent a defect such that the shape of the forming die is not accurately transferred to the sealing member due to entrainment of gas.

Under the reduced-pressure atmosphere, it is preferable to fill inert gas (e.g., nitrogen gas) into the chamber in order to prevent deterioration of the LED element caused by impurity gas. Furthermore, by introducing oxygen gas into the camber in addition to the inert gas, it is possible to improve a contact property between the LED element and an electrode thereof, and to prevent a blackening phenomenon of the glass caused by removal of the oxygen included in the glass which is a material of the sealing member.

The same gas as that used in the above-mentioned reduced-pressure atmosphere is preferably added also under the normal temperature atmosphere.

A second aspect of the invention provides a method of manufacturing a LED lamp in which, in addition to the above-mentioned first aspect, the LED element is flip-chip mounted or face-up mounted, and it is possible to easily and surely mount the LED element on the substrate.

A third aspect of the invention provides a method of manufacturing a LED lamp includes, in addition to the above-mentioned first or second aspect, a phosphor supply process for supplying phosphor to the vicinity of the LED element before the third process (sealing process). A phosphor material, which is excited by an emission color of the LED element and emits fluorescence, is used. For example, as for the phosphor material, the same material as the scaling member is used as a base material, a phosphor material is dispersed in the base material, and a phosphor layer is provided in the vicinity of the LED element. The base material is a material which is not softened at the temperature during the sealing process, and it is better if the refractive index thereof is comparable to that of the sealing member. For example, yttrium aluminum garnet (YAG) is used as a base material, and Ce therein as a phosphor material is activated.

A fourth aspect of the invention provides a method of manufacturing a LED lamp includes, in addition to the above-mentioned first to third aspects, a reflective layer forming process for forming a reflective layer on a surface of the sealing member opposite to a substrate after the third process (sealing process). When such a reflective layer is formed, a portion of the light from the LED element is reflected at the reflective layer and is emitted from the substrate side to outside, which is so-called a reflective LED lamp. The reflective layer can be formed by vapor deposition or sputtering of metal having high reflectance such as aluminum (Al) or silver (Ag), or by applying white ink.

Alternatively, a so-called two-layer sealing may be carried out by further forming a sealing member including a phosphor material on the above-mentioned surface of the sealing member after the third process (sealing process). Furthermore, it is not limited to two layers, and a multilayer sealing of two or more layers may be carried out. In this case, not all of layers need to include the phosphor material, and it is arbitrarily decided whether or not the phosphor material is included. Preferably, the uppermost layer does not include the phosphor material in case of the multilayer sealing in order to prevent the phosphor layer from deteriorating due to the contact with the outside.

In addition, a wavelength-selective reflective layer may be formed in the layers of the multilayer sealing. For example, if the light of the LED element is ultraviolet light and a white light-emitting LED lamp is formed by multiple phosphor layers of which excitation light is the ultraviolet light, radiation of the ultraviolet light to the outside may cause a problem. In this case, the radiation of the ultraviolet light to the outside is prevented by using the wavelength-selective reflective layer such as dichroic mirror which reflects the ultraviolet light.

A fifth aspect of the invention provides a method of manufacturing a LED lamp in which, in addition to the above-mentioned first to fourth aspects, in the second process (sealing member preparation process), the forming surface of the concave portion of the sealing member has a substrate-facing surface which faces a side surface of the substrate, and in the third process (sealing process), the substrate-facing surface faces the side surface of the substrate when the forming surface of the concave portion is arranged to face the LED element and the substrate-facing surface is along the side surface of the substrate when the sealing member is bonded on the substrate side by the thermal compression.

This allows the efficiency of light extraction to the lateral side of the substrate to be improved since the sealing member seals the LED element as well as wraps around the side surface of the substrate. It should be noted that "the side surface of the substrate" here indicates a surface which connects a mounting surface of the substrate for mounting the LED chip to a surface opposite to the mounting surface.

A sixth aspect of the invention provides a method of manufacturing a LED lamp in which, in addition to the above-mentioned first to fifth aspects, plural LED elements are mounted on one substrate in the first process (mounting process) and a separation process for separating the substrate after the mounting process is further included.

A seventh aspect of the invention provides a method of manufacturing a LED lamp in which, in addition to the configuration of the above-mentioned sixth aspect, each of the separated substrates is set to one lower die in a state that the substrates are isolated from each other in the third process (sealing process).

When there is a large difference between a linear expansion coefficient of the substrate and that of the sealing member, a difference in an amount of expansion/shrinkage between the substrate and the sealing member at the time of the thermal compression bonding becomes significant, which may lead to generation of cracks in the sealing member, however, the influence of the difference in the amount of expansion/shrinkage is reduced by separating and isolating the substrates, the generation of the cracks in the sealing member is thus prevented.

Alternatively, in the separation process, the substrates may be separated for each LED element or for every predetermined number of LED elements among plural LED elements.

An eighth aspect of the invention provides a method of manufacturing a LED lamp in which, in addition to the configuration of the above-mentioned seventh aspect, each of the separated substrates is set to the lower die in a state a spacer each intervenes therebetween in the third process (sealing process).

This allows a position of the separated substrate to be determined by a spacer located between the adjacent substrates. Thickness of the spacer can be substantially the same as or thinner than that of the substrate.

A ninth aspect of the invention provides a method of manufacturing a LED lamp in which, in addition to the configuration of the above-mentioned seventh aspect, each of the separated substrates is set in a substrate housing portion formed on the lower die in the third process (sealing process) and the substrate housing portion is each formed for every separated substrate.

This allows the position of the separated substrate to be determined by the substrate housing portion formed on the lower die. The depth of the substrate housing portion can be substantially the same as or shallower than the thickness of the substrate.

A tenth aspect of the invention provides a method of manufacturing a LED lamp in which, in addition to the above-mentioned sixth to ninth aspects, the sealing member is provided with a main body having the concave portion and a basal portion bonded to the substrate by thermal compression and is an integrated object in which the main body is coupled to the basal portions, and the sealing member as the integrated object is set to a die.

This facilitates the handling such as setting on the die since the sealing member is an integrated object, thereby improving workability.

An eleventh aspect of the invention provides a method of manufacturing a LED lamp in which, in addition to the above-mentioned tenth aspect, an upper die for pressing the sealing member has a void portion at a portion thereof facing the basal portion of the sealing member.

This reduces the compressive force of the sealing member against the lower die Of the spacer since the upper die having a void portion is used and the sealing member softened and deformed at the time of thermal compression bonding thus escapes into the void portion, thereby preventing the sealing member from adhering to the lower die or the spacer.

A twelfth aspect of the invention provides a method of manufacturing a LED lamp in which, in addition to the above-mentioned sixth to ninth aspects, the sealing member is provided with a main body having the concave portion and a basal portion bonded to the substrate by thermal compression and the sealing member is set to a die for each of the separated substrates in a state that the basal portion is isolated.

This allows the positioning of the sealing member for each separated substrate, thereby preventing the misalignment. Furthermore, when the substrate is separated for each of the LED elements, a LED lamp is separately formed for each substrate, and thus, it is not necessary to dice. When the dicing is required, it is necessary to configure the arrangement of LED elements or height of sealing member (lens height) in light of a drawn amount of the dicing blade or a flange height of dicing apparatus, however, since it is not necessary to consider the above, design freedom of the LED lamp is improved.

A thirteenth aspect of the invention provides a method of manufacturing a LED lamp in which, in addition to the above-mentioned first to fifth aspects, plural LED elements are mounted on one substrate in the first process (mounting process), the sealing member is provided with a main body having the concave portion and a basal portion bonded to the substrate by thermal compression and the sealing member is set to one die in a state that the basal portion is isolated.

This reduces the influence of the difference in the amount of expansion/shrinkage between the substrate and the sealing member even though the sealing member is separated and bonded by the thermal compression, and it is thereby possible to prevent the generation of the cracks in the sealing member.

A fourteenth aspect of the invention provides a method of manufacturing a LED lamp in which, in addition to the above-mentioned tenth to thirteenth aspects, the main body has a lens shape.

As described above, a shape of the upper die may be appropriately set in accordance with the lens shape in order to provide a desired lens shape (e.g., convex lens, condenser lens or concave lens, etc.) on the sealing member.

A fifteenth aspect of the invention provides a method of manufacturing a LED lamp in which, in addition to the above-mentioned first to eleventh and fourteenth aspects, the sealing member is prevented from moving toward a surface direction of the substrate in the third process (sealing process).

In the meantime, in the third process (sealing process), the softened sealing member is going to move to a surface direction from the middle to peripheral edge portion of the substrate (the die). The movement of the sealing member disturbs the deformation of the forming surface of the concave portion along the LED element. As a result, the forming surface of the concave portion is not deformed along the LED element at a portion located on a peripheral edge portion side of a side wall of a LED element 20, hence, there is a possibility that a hollow portion which is generated by the deformation of the concave portion remains at the above-mentioned portion even after completion of the sealing process.

Thus, according to the fifteenth aspect, since the movement of the sealing member is prevented, it is possible to surely deform the forming surface of the concave portion along the LED element, thereby surely sealing the LED element 20.

A sixteenth aspect of the invention provides a die used in the above-mentioned fifteenth aspect, and the die is provided with a restricting means for preventing the sealing member from moving toward the surface direction.

A seventeenth aspect of the invention provides a die in which, in addition to the above-mentioned sixteenth aspect, the restricting means is composed of a convex portion provided on an upper or lower die.

This restricts and prevents the movement of the sealing member by the convex portion even if the softened sealing material is going to move to a surface direction from the middle to peripheral edge portion of the substrate (the die), and it is thus possible to surely deform the forming surface of the concave portion along the LED element, thereby surely sealing the LED element.

An eighteenth aspect of the invention provides a die in which, in addition to the above-mentioned seventeenth aspect, plural LED elements are set to the lower die and the convex portion is provided so as to surround each of the plural LED elements.

This restricts the movement of the sealing member for each individual LED element by the convex portion each surrounding the LED element even if the softened sealing material is going to move to a surface direction from the middle to peripheral edge portion of the substrate (the die), and thus, the effect of the above-mentioned seventeenth aspect is surely obtained.

A nineteenth aspect of the invention provides a die in which, in addition to the above-mentioned seventeenth aspect, plural LED elements are set to the lower die and the convex portion is provided along a peripheral edge of the upper or lower die.

In the meantime, although the softened sealing material moves in a surface direction from the middle to peripheral edge portion of the die, the movement of the sealing member significantly occurs specifically at an outer peripheral edge portion of the (upper or lower) die, but hardly occurs at the middle portion.

Therefore, according to the above-mentioned nineteenth aspect, the effect relatively comparable to the above-mentioned seventeenth aspect is obtained, and furthermore, since it is possible to manufacture at low cost due to the simple structure of the die, it is possible to reduce the manufacturing cost of the LED lamp.

A twentieth aspect of the invention provides a die in which, in addition to the above-mentioned sixteenth to nineteenth aspects, a contact avoidance portion for avoiding contact with a tip portion of the convex portion is formed in the sealing member.

This avoids the contact of tip portion of the convex portion with the sealing member, which allows to prevent the adhesion of the tip portion of the convex portion to the sealing member, and it is thus possible to easily pull out the sealing member from the upper die.

Each embodiment of the invention will be explained in detail below with reference to the drawings. In each embodiment, the same components and the same constituent elements are indicated by the same reference numerals, and the overlapped explanation will be omitted for the same contents.

In addition, each embodiment can be implemented in an appropriate combination, and in that case, it is possible to combine the functions and effects of the combined embodiment or to obtain the synergistic effect.

First Embodiment

FIG. 1 is a flow diagram of a first embodiment. FIG. 2 is a schematic vertical cross sectional view for illustrating manufacturing processes in the first embodiment.

As shown in FIG. 1, a mounting process for flip-chip-mounting a LED element on a substrate (S1), a sealing member preparation process for preparing a sealing member provided with a concave portion capable of housing the LED element (S2), and a sealing process in which the sealing member is arranged so that a forming surface of the concave portion of the sealing member faces the LED element, the sealing member is bonded to the substrate by thermally compressing on the substrate side and the forming surface of the concave portion is made along the LED element (S3) are included.

Figure 2A:
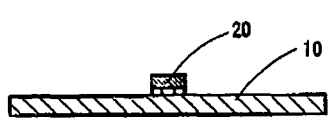
FIG. 2 is a schematic vertical cross sectional view for illustrating manufacturing processes in the first embodiment.

As shown in FIG. 2(A), a LED element 20 is flip-chip-mounted on a substrate 10 in the mounting process (S1). The substrate 10 is a ceramic substrate. The LED element 20 is a flip-chip type LED element and generates white light. The LED element 20 is flip-chip-mounted on a substrate 10 via a metal bump.

Figure 2D:
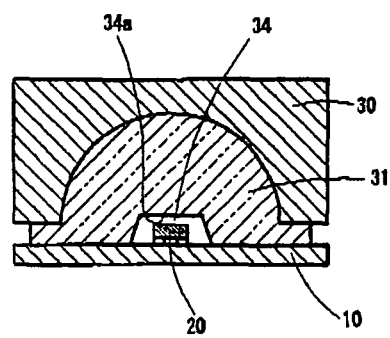
Figure 2B:
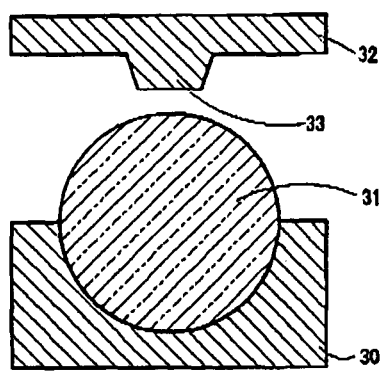

Next, as shown in FIG. 2(B), a spherical sealing member 31 having a shape corresponding to a hemispherical concave portion of a sealing member forming die 30 is arranged therein in the sealing member preparation process (S2).

A material of the sealing member 31 is glass, and it is possible to use glass in which a small amount of alkali metal oxide such as lithium oxide ($LiO_2$) or sodium oxide ($Na_2O$) is added to a base glass consisting mainly of zinc oxide (ZnO) such as zinc oxide-boron oxide-silicon oxide-niobium oxide ($ZnO$—$B_2O_3$—$SiO_2$—$Nb_2O_5$) system or zinc oxide-boron oxide-silicon oxide-bismuth oxide ($ZnO$—$B_2O_3$—$SiO_2$—$Bi_2O_3$) system.

Tg of the sealing member 31 is 485° C. and Ap thereof is 520° C. Alternatively, the sealing member 31 may include a phosphor material.

Figure 2E:
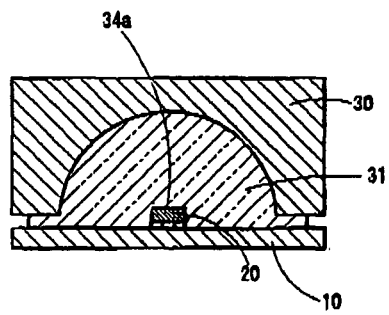
Figure 2C:
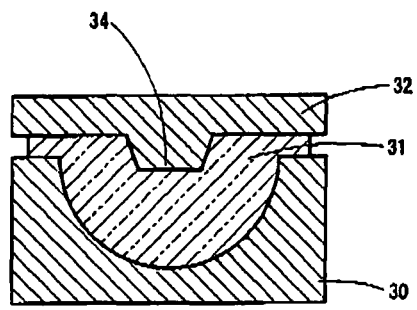

After that, as shown in FIGS. 2(B) and 2(C), the sealing member 31 is molded by pressing down a concave portion forming die 32 provided with a convex portion 33 against the sealing member 31. As a result, a concave portion 34 is formed on the sealing member 31. A vertical cross sectional shape of the concave portion 34 is a trapezoidal shape in which a sealing member 31 side is a short side, and is larger than an outer shape of the LED element 20. Therefore, a cavity enclosed by a forming surface of the concave portion 34 is larger than the outer shape of the LED element 20.

Figure 2F:
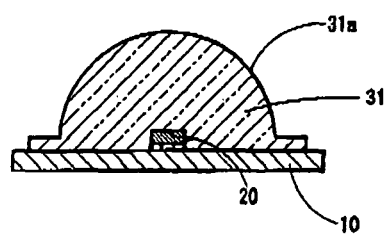
Figure 3A:
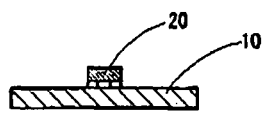
FIG. 3 is a schematic vertical cross sectional view for illustrating manufacturing processes in a first modification of the first embodiment.
Figure 3D:
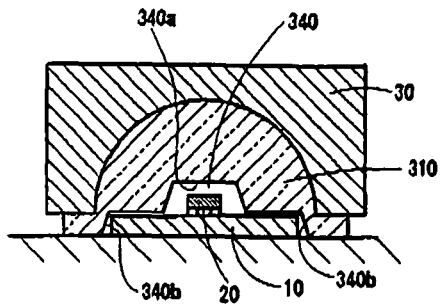
Figure 3B:
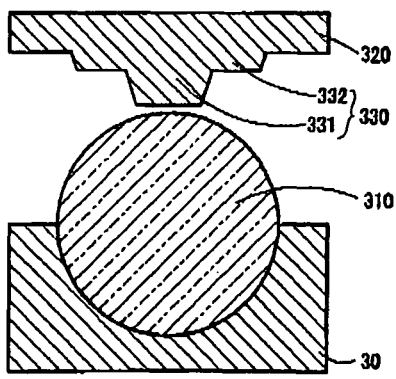
Figure 3E:
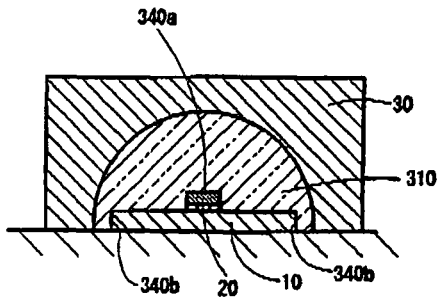
Figure 3C:
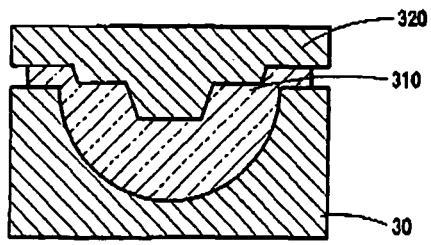
Figure 3F:
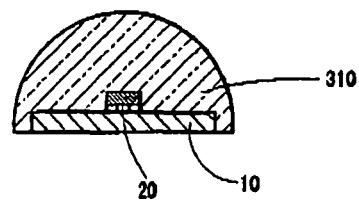

As shown in FIG. 2(D), the sealing member 31 is arranged on the substrate 10 so that the forming surface of the concave portion 34 of the sealing member 31 faces the LED element 20 in the sealing process (S3). At this time, since the cavity enclosed by a forming surface 34a of the concave portion 34 is larger than the outer shape of the LED element 20, the LED element 20 does not contact with the forming surface 34a. In addition, as shown in FIG. 2(E), the sealing member 31 is bonded to the substrate 10 by thermally compressing on the substrate 10 side, and the forming surface 34a of the concave portion 34 is made along the LED element 20. The thermal compression bonding temperature is 520° C. which is the same as Tg of the sealing member. The LED element 20 is sealed by deformation of the forming surface 34a of the concave portion 34 along the LED element 20 as shown in FIG. 2(F).

According to the first embodiment, since the sealing member 31 is bonded to the substrate 10 by thermal compression in the sealing process (S3) so that the LED element 20 is located in the concave portion 34 of the sealing member 31, the LED element 20 is not directly pressed when the sealing member 31 is pressed against the substrate 10. As a result, breakage or misalignment of the LED element 20 is prevented.

By preliminarily forming the concave portion 34 on the sealing member 31 in the sealing member preparation process (S2) which is performed prior to the sealing process (S3), it is not necessary to move a forming material of the sealing material 31 equivalent to volume of the LED element 20 in the sealing process (S3), which would be necessary in case of deformation, etc., it is possible to bond by thermal compression at the yielding point temperature which is lower than the softening point temperature. Thus, the sealing material 31 is not excessively softened, and a lens surface 31a of the sealing material 31 (a surface of the sealing material 31 opposite to the substrate 10) does not adhere to the sealing member forming die 30. Therefore, the sealing member forming die 30 can have high surface accuracy. By using the sealing member forming die 30 having high surface accuracy as described above, the lens surface 31a of the sealing material 31 is smoothed and becomes a further precise lens shape. In addition, since the thermal compression bonding is conventionally performed at the yielding point temperature which is lower than the softening point temperature, influence of the heat on the LED element 20 is reduced and the breakage of the LED element 20 due to the heat is prevented.

First Modification of the First Embodiment

FIG. 3 is a schematic vertical cross sectional view for illustrating manufacturing processes in a first modification of the first embodiment.

Firstly, as shown in FIG. 3(A'), the LED element 20 is mounted on the substrate 10 in the same manner as the mounting process (S1) in the first embodiment.

Next, as shown in FIG. 3(B'), the a spherical sealing member 310 having a shape corresponding to a hemispherical concave portion of a sealing member forming die 30 is arranged therein in the sealing member preparation process (S2). A composition of the sealing member 310 is the same as that of the above-mentioned sealing member 31. After that, as shown FIGS. 3(B') and 3(C'), the sealing member 310 is molded by pressing down a concave portion forming die 320 provided with a convex portion 330 thereon. The convex portion 330 is composed of a center portion 331 which is slightly larger than the outer shape of the LED element and a basal portion 332 which is slightly larger than the substrate 10. Thus, a concave portion 340 is formed on the sealing member 310. A cavity enclosed by a forming surface 340a of the concave portion 340 is slightly larger than the outer shape of the LED element 20 and that of the substrate 10.

In the sealing process (S3), the sealing member 310 is arranged on the substrate 10 so that the forming surface 340a located at the center of the concave portion 340 of the sealing member 310 faces the LED element 20 as well as forming surfaces 340b on both end sides of the concave portion 340 face side surfaces 101 of the substrate 10, as shown in FIG. 3(D'). At this time, since the cavity of the concave portion 340 enclosed by the forming surface 340a and the forming surfaces 340b is larger than the outer shape of the LED element 20 and that of the substrate 10, the LED element 20 does not contact with the forming surface 340a of the concave portion 340. Then, as shown in FIG. 3(E'), the sealing member 310 is bonded to the substrate 10 by thermally compressing on the substrate 10 side, and thus, the forming surfaces 340b of the concave portion 340 are made along the side surfaces 101 of the substrate 10 and the forming surface 340a of the concave portion 340 is made along the LED element 20. The heating temperature is about 520° C. in the same manner as the first embodiment. The forming surface 340a of the concave portion 340 is deformed along the LED element 20 and the forming surfaces 340b are deformed along the side surfaces 101 of the substrate 10. After that, as shown in FIG. 3(F'), the sealing member forming die 30 is pulled up, and the LED element 20 is thereby sealed with the sealing member 310.

As described above, the same effect as the first embodiment is achieved by the first modification of the first embodiment. Furthermore, the sealing member 310 wraps around the side surfaces 101 of the substrate 10, thereby improving the efficiency of light extraction to the lateral side of the LED lamp.

Second Modification of the First Embodiment

FIG. 4 is a schematic vertical cross sectional view for illustrating manufacturing processes in a second modification of the first embodiment.

Figure 4A:
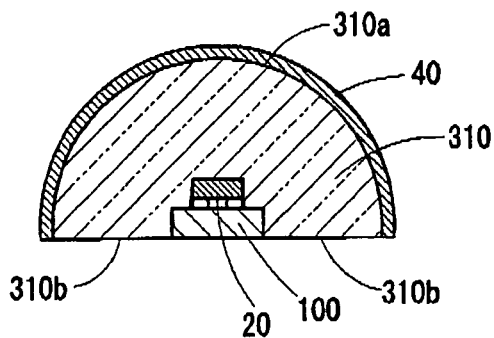
FIG. 4 is a schematic vertical cross sectional view for illustrating manufacturing processes in a second modification of the first embodiment.

FIG. 4(A) is an example of including a process for forming a reflective layer 40 on a lens surface 310a of the sealing member 310 (a surface of the sealing member 310 opposite to a substrate 100) (a reflective layer forming process) after the scaling process (S3). The reflective layer 40 is formed on the substantially whole area of the lens surface 310a by sputtering aluminum. The material of the reflective layer includes high-reflectivity metal material such as aluminum, aluminum alloy, silver and silver alloy. Alternatively, a metal layer (not shown) such as gold, which is not metamorphosed due to impurity in the air, may be further formed in order to prevent time degradation of the reflectance of the reflective layer. It should be noted that the substrate 100 is the same as the substrate 10 expect that a width thereof is smaller than that of the substrate 10. The light of the LED element 20 is reflected toward the substrate 100 side by the reflective layer 40. Since the substrate 100 is formed to be narrower than the substrate 10, the reflected light is emitted to the outside from a surface 310b of the sealing member 310 which is exposed on the substrate 100 side.

Figure 4C:
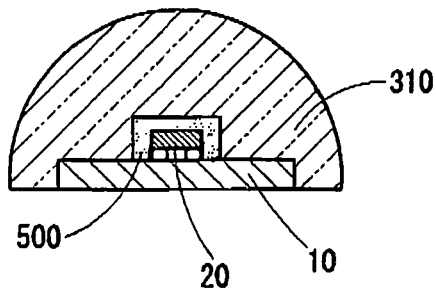
Figure 4B:
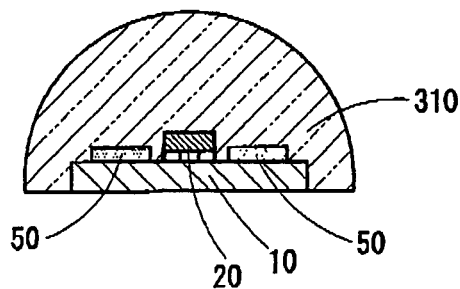

FIG. 4(B) is an example of including a process for forming a phosphor layer 50 by supplying a phosphor material to a region of the substrate 10 in the vicinity of the LED element 20 (a phosphor supply process). Since the phosphor material excites the light of the LED element 20, the phosphor layer 50 emits fluorescence when a portion of the light of the LED element 20 reaches the phosphor layer 50. Then, since the fluorescence is mixed with the light of the LED element 20, an emission color different from that of the light of the LED element 20 is obtained.

FIG. 4(C) is an example of including a process for forming a phosphor layer 500 (a phosphor supply process) in which, after a metal alkoxide solution including the phosphor material is potted at a peripheral portion of the LED element 20, the phosphor layer 500 formed of sol-gel glass as base glass which is the above-mentioned solution solidified by hydrolysis reaction is formed at the peripheral portion of the LED element 20. Also in this example, it is possible to obtain the an emission color different from that of the light of the LED element 20 in the same manner as the example of FIG. 4(B).

Figure 4D:
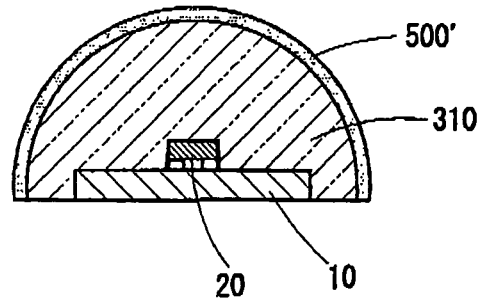
Figure 4E:
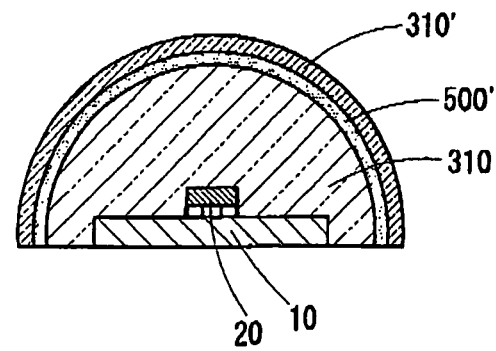

FIG. 4(D) is an example of including a process for further forming a phosphor layer 500' on a surface of the sealing member 310. As a base material of the phosphor layer 500', it is possible to use an inorganic material such as the above-mentioned low-melting-point glass or the sol-gel glass, or a resin material such as epoxy resin or silicon resin. In addition, as shown in FIG. 4(E), a scaling member 310' may be further formed on a surface of the phosphor layer 500'. Alternatively, both of the sealing members 310 and 310' may include the phosphor material. However, in order to suppress deterioration of fluorescence properties caused by moisture or impurity in the air introduced into the phosphor material in the phosphor layer 500', it is preferable that the sealing member 310' does not include the phosphor material. Furthermore, even in the typical sealing member in which the phosphor layer 500' does not include the phosphor material, the total reflection caused by a refractive index difference between the sealing members can be reduced by selecting a material of the sealing member so that the refractive index of the sealing member is gradually decreased with increasing the distance from the LED element 20. Therefore, the light extraction efficiency of the LED lamp is improved.

Third Modification of the First Embodiment

FIG. 5 is a schematic vertical cross sectional view for explaining a third modification of the first embodiment.

The illustration of electrode each formed on surfaces of an n-layer 52 and a p-layer 54 is omitted in FIG. 5.

Figure 5A:
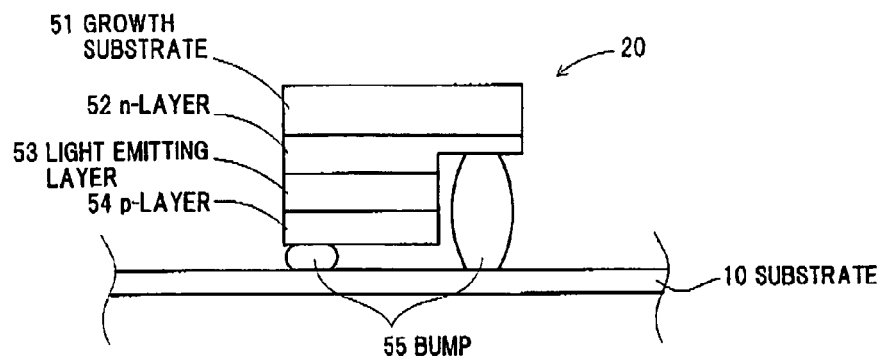
FIG. 5 is a schematic vertical cross sectional view for explaining a third modification of the first embodiment.

As shown in FIG. 5(A), the first embodiment shows an example in which the LED element 20 is flip-chip-mounted to electrically connect a substrate 10 via a bump 55 in the mounting process (S1). In other words, an n-layer 52, a light emitting layer 53 and a p-layer 54 are laminated on a growth substrate 51 in this order, and are subsequently patterned so as to expose a surface side of the n-layer 52, thereby manufacturing the LED element 20. Then, the LED element 20 is arranged on the substrate 10 after each of the layers 52 to 54 is turned over from the state at the time of formation, and the n-layer 52 and the p-layer 54 are each electrically connected to a wiring pattern (illustration omitted) on the substrate 10 by the bump 55, thereby completing the flip-chip-mounting.

Figure 5B:
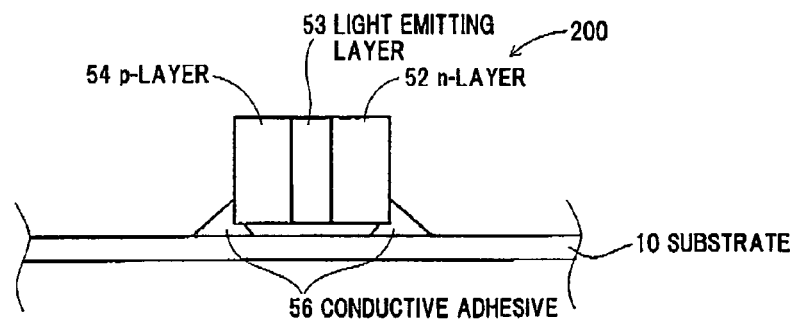

In the meantime, as shown in FIG. 5(B), a mounting method, in which each of layers 52 to 54 which compose the LED element 200 is arranged on the substrate 10 so that lamination directions thereof are parallel and the n-layer 52 and the p-layer 54 are each electrically connected to a wiring pattern (illustration omitted) on the substrate 10 by a conductive adhesive 56 (generally called "horizontal mounting") may be employed.

Figure 5C:
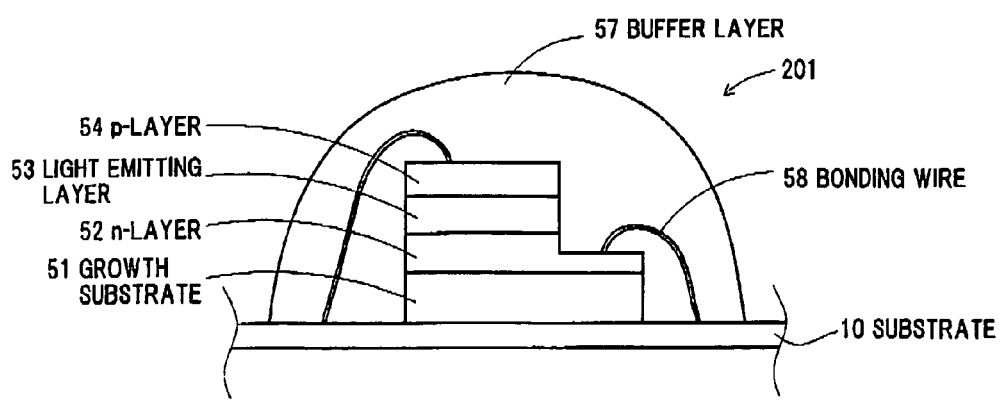

In addition, as shown in FIG. 5(C), a face-up mounting, in which a LED element 201 is mounted on the substrate 10 in the same state as during the formation of each of the layers 52 to 54 and the n-layer 52 and the p-layer 54 are each electrically connected to a wiring pattern (illustration omitted) on the substrate 10 by a bonding wire 58, may be employed. However, since the sealing process is performed using general glass at higher viscosity than the thermal compression bonding in the invention, the collapse of the bonding wire 58 is concerned. Therefore, from the viewpoint of protecting the bonding wire 58, a buffer layer 57 formed of sol-gel glass, etc., is preferably provided so as to cover the surfaces of the LED element 201 and the bonding wire 58.

As described above, if the LED element 20 is flip-chip-mounted or face-up mounted, it is possible to easily and surely mount the LED element 20 on the substrate 10.

Alternatively, when the LED element 20 is flip-chip-mounted as shown in FIG. 5(A), the LED element 20 may be bonded to the substrate 10 by a bonding layer which is provided between the substrate 10 and the LED element 20, instead of using the bump 55.

Here, the bonding layer only needs to be provided on a joining surface of the LED element 20 or at least any one of joining surfaces of the substrate 10.

Then, for example, a gold-tin (AuSn) solder layer or a metal thin film layer formed of paste including metal fine particles of gold, silver, platinum or palladium, etc., may be used for the bonding layer.

When the metal thin film layer is used as the bonding layer, a void formed between the metal fine particles allows movement or deformation of the metal fine particles and the metal fine particles fused by pressure bonding, thus, a stress generated due to the difference in the amount of expansion/shrinkage between the LED element 20 and the substrate 10, etc., is reduce and the LED element 20 is prevented from being broken or separating from the substrate 10.

It should be noted that, when the metal thin film layer is used as the bonding layer, metal films formed of the same type of metal as the metal thin film layer are preferably provided on both of the joining surface of the LED element 20 and that of the substrate 10. It is because a portion of the metal fine particles of the metal thin film layer enters the metal layers respectively provided on the joining surface of the LED element 20 and that of the substrate 10 at the time of pressure bonding, thereby increasing adhesiveness.

Alternatively, gold plated layers may be provided on both of the joining surface of the LED element 20 and that of the substrate 10, and activated by radiating plasma thereon so as to be bonded each other at a normal temperature.

Second Embodiment

FIG. 6 is a schematic vertical cross sectional view for illustrating manufacturing processes in a second embodiment of the invention.

Figure 6A:
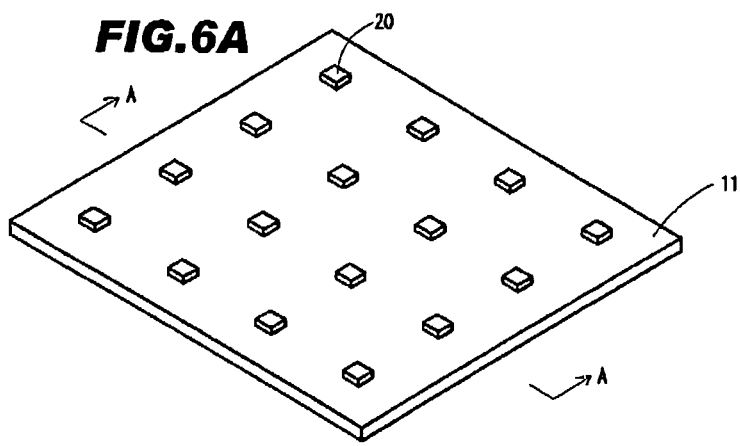
FIG. 6 is a schematic vertical cross sectional view for illustrating manufacturing processes in a second embodiment of the invention.
Figure 6B:
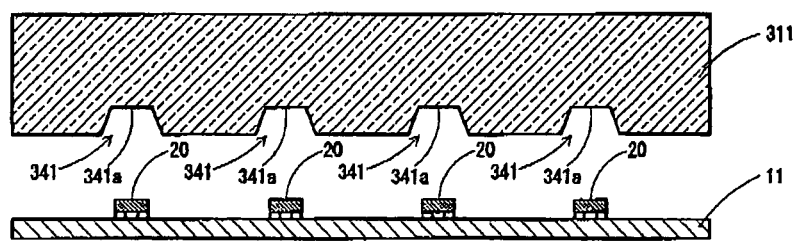

Firstly, as shown in FIG. 6(A), multiple LED elements 20 (sixteen in this example) are mounted on the substrate 11 by vertically and horizontally arranging in a square pattern at equal intervals. Next, a sealing member 311 is prepared. As shown in FIG. 6(B) which is a cross section taken on line A-A of FIG. 6(A), the sealing member 311 includes plural concave portions 341 having a trapezoidal vertical cross sectional shape at positions facing each of the LED elements 20.

The sealing member 311 is formed of the same material as the sealing member 31 and the concave portion 341 is formed in the same manner as the concave portion 34 of the sealing member 31.

Figure 6C:
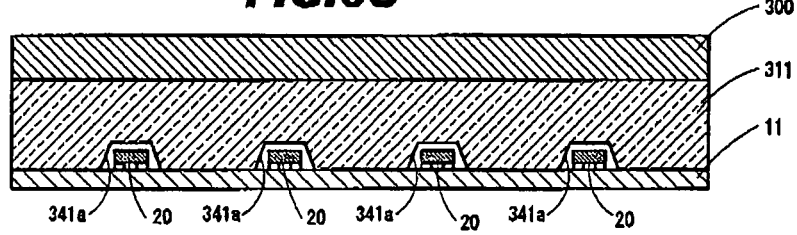
Figure 6D:
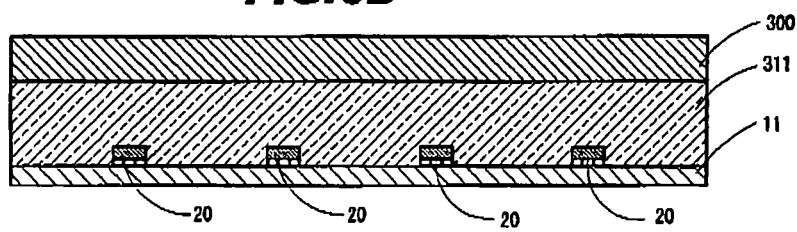

Then, as shown in FIG. 6(C), the sealing member 311 is arranged on the substrate 11 so that the concave portion 341a of each concave portion 341 encloses the corresponding LED element 20. After that, as shown in FIG. 6(D), the sealing member 311 is bonded to the substrate 11 by thermally compressing an upper die (sealing member forming die) 300 on the substrate 11 side, and the forming surface 341a of the concave portion 341 is made along the LED element 20.

Figure 6E:
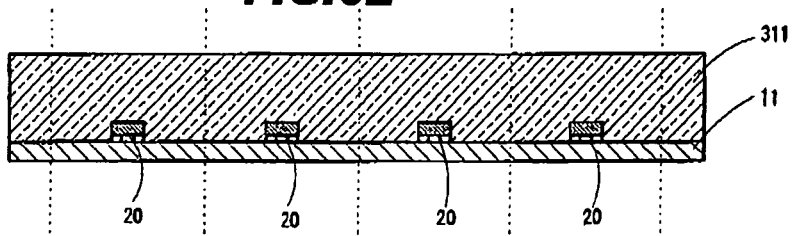

The LED element 20 is sealed by deformation of the forming surface 341a of the concave portion 341 along the LED element 20. As shown in FIG. 6(E), plural individual LED lamps are formed by dicing for each sealed LED element 20 at positions indicated by dashed lines shown in the figure.

As described above, the same effect as the first embodiment is achieved by the second embodiment. Alternatively, the shape of the sealing member 311 may be formed in a cylindrical shape by linearly arranging the LED elements 20.

The temperature of the upper die 300 can be set by experimentally forming an optimum temperature range so that the above-mentioned function and effect are surely obtained, and for example, it may be set within a range from the normal temperature to Ap.

Third Embodiment

FIG. 7 is a schematic vertical cross sectional view for illustrating manufacturing processes in a third embodiment.

Figure 7A:
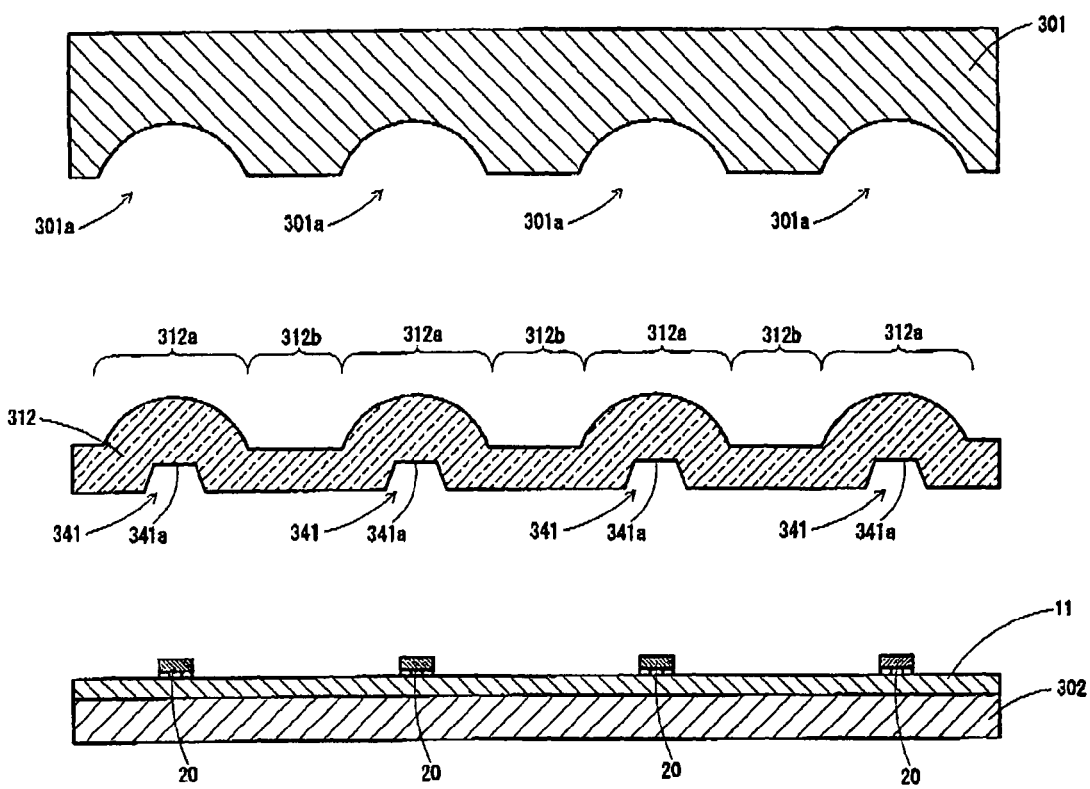
FIG. 7 is a schematic vertical cross sectional view for illustrating manufacturing processes in a third embodiment of the invention.

The third embodiment is different from the second embodiment (see FIG. 6) in that, as shown in FIG. 7(A), (a) a sealing member 312 provided with a lens forming portion (main body) 312a having a concave portion 341 and a basal portion 312b connecting the adjacent lens forming portions (main bodies) 312a and bonded to the substrate 10 by pressure is used instead of the sealing member 311 and (b) an upper die (sealing member forming die) 301 provided with concave portions 301a along the lens forming portions (main bodies) 312a of the sealing member 312 is used instead of the upper die 300.

The sealing member 312 is formed of the same material as the sealing member 311.

Figure 7B:
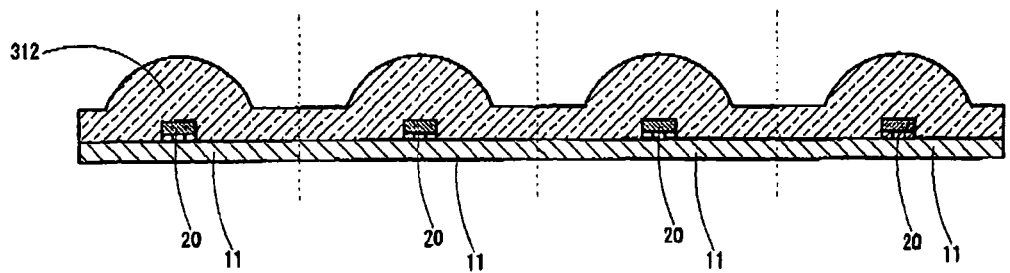

Then, as shown in FIG. 7(B), the basal portion 312b of the a sealing member 321 is bonded to the substrate 11 by thermal compression by pressing down the upper die 301. After that, individual pieces are formed by dicing at the positions indicated by the dashed lines. As a result, a LED lamp provided with a lens-shaped light-emitting surface is formed.

According to the third embodiment, since the sealing member 312 is provided with the lens forming portion (main body) 312a having a concave portion 341 and the basal portion 312b bonded to the substrate 11 by thermal compression and is an integrated object in which the lens forming portion (main body) 312a is coupled by the basal portion 312b, the handling such as setting on the die is facilitated and the workability is improved.

Fourth Embodiment

FIG. 8 is a schematic vertical cross sectional view for illustrating manufacturing processes in a fourth embodiment.

Figure 8A:
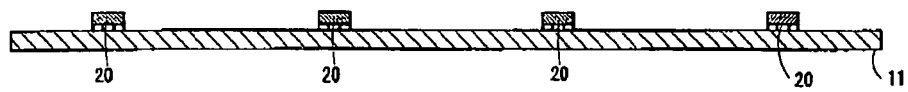
FIG. 8 is a schematic vertical cross sectional view for illustrating manufacturing processes in a fourth embodiment of the invention.
Figure 8B:
Figure 8C:
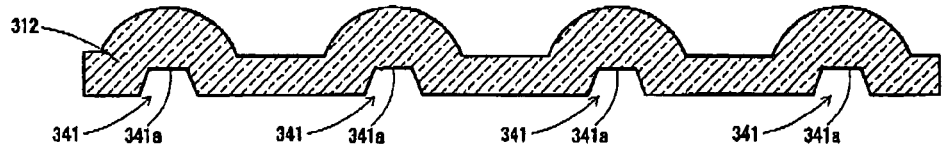
Figure 8D:
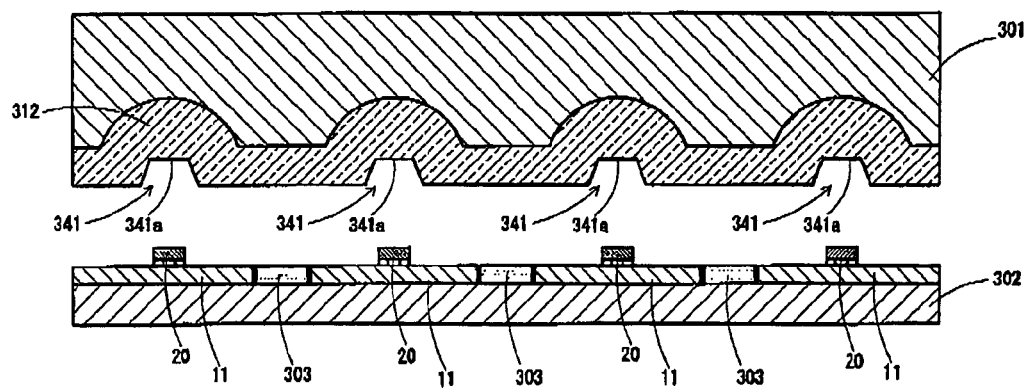

Firstly, as shown in FIG. 8(A), plural LED elements 20 are mounted on the substrate 11 at predetermined intervals. After that, as shown in FIG. 8(B), the substrate 11 is divided by each LED element 20. Next, as shown in FIG. 8(C), the sealing member 312 is prepared. After that, as shown in FIG. 8(D), the separated substrates 11 are set on a lower die (underside die) 302 in the state that the substrates 11 are isolated from each other.

A spacer 303 formed of the same material as the lower die 302 is placed on the lower die 302. The spacer 303 may be an integrated spacer or plural spacers combined together.

The spacer 303 is arranged between the substrates 11 which are arranged in a separated state, which results in that the substrates 11 are positioned. The thickness of the spacer 303 is substantially the same as that of the substrate 11.

Figure 8E:
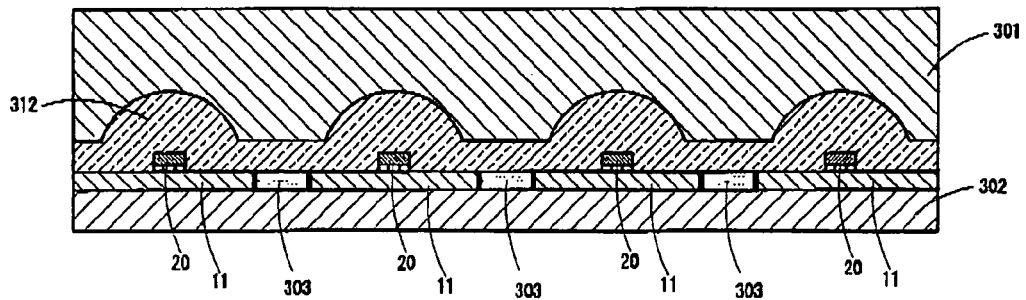
Figure 8F:
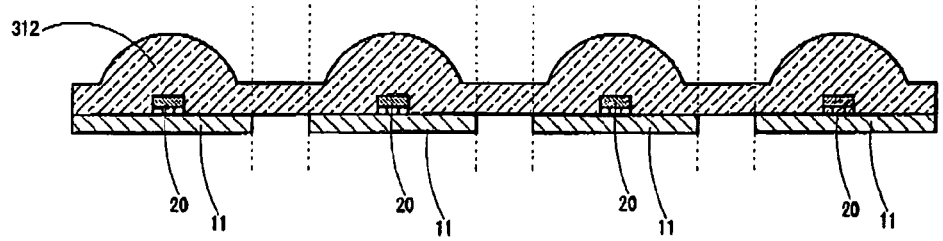

Then, as shown in FIG. 8(E), the sealing member 312 is bonded to the substrate 11 by thermally compressing an upper die 301 on the substrate 11 side, and the forming surface 341a of the concave portion 341 is made along the LED element 20. The LED element 20 is sealed by deformation of the forming surface 341a of the concave portion 341 along the LED element 20.

According to the fourth embodiment, since the substrates 11 are set on the lower die 302 in the state that the spacer 303 each intervenes between each of the divided substrates 11, it is possible to separate and isolate the substrate 11, the influence of the difference in the amount of expansion/shrinkage between the substrate 11 and the sealing member 312 is reduced, and the generation of the cracks in the sealing member 312 is prevented.

Furthermore, it is possible to determine the position of the separated substrate 11 by the spacer 303 located between the adjacent substrates 11.

Although the substrate is separated after the LED element 20 is mounted on the substrate 11 in the fourth embodiment, a substrate preliminary separated in a predetermined size may be used, arranged on the lower die 302 after each mounting the LED element 20 thereon, and sealed by the sealing member 312.

Fifth Embodiment

Figure 9:
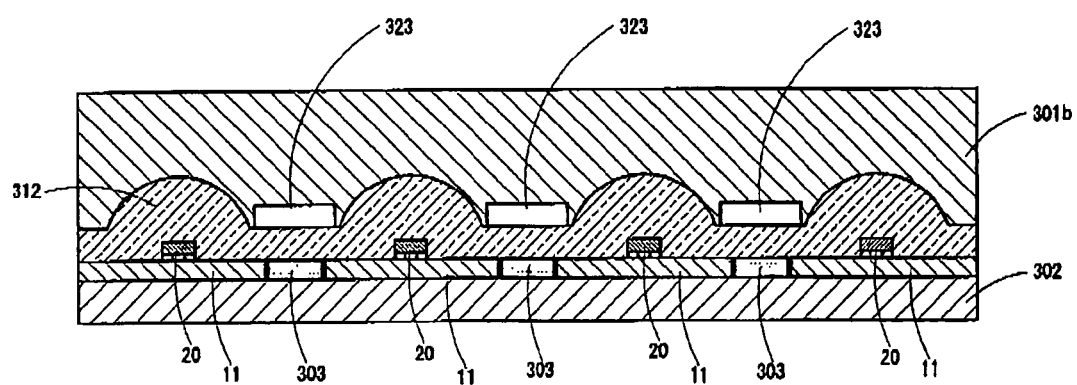
FIG. 9 is a schematic vertical cross sectional view for explaining a fifth embodiment of the invention.

FIG. 9 is a schematic vertical cross sectional view for explaining a fifth embodiment.

The fifth embodiment is different from the fourth embodiment (see FIG. 8) only in that an upper die 301b having a void portion 323 at a portion facing the spacer 303 across the sealing member 312 is used instead of the upper die 301.

In general, the temperature of the upper die 301 is set lower than that of the lower die 302 so that the glass sealing member 312 does not adhere to the upper die 301, however, there is a possibility that the spacer 303 placed on the lower die 302 having a higher temperature adheres to the sealing member 312 at the time of the thermal compression bonding.

Therefore, in the fifth embodiment, since the sealing member 312 softened and deformed at the time of the thermal compression bonding escapes into the void portion 323 by using the upper die 301b having the void portion 323, the compressive force of the sealing member 312 against the spacer 303 is reduced, thereby preventing the sealing member 312 from adhering to the spacer 303.

For the void portion 323, the optimum size and shape may be experimentally found so that the above-mentioned function and effect are surely obtained.

Sixth Embodiment

FIG. 10 is a schematic vertical cross sectional view for illustrating manufacturing processes in a sixth embodiment.

The sixth embodiment is different from the fourth embodiment (see FIG. 8) in that a sealing member 313 is used instead of the sealing member 312. The sealing member 313 is formed of the same material as the sealing member 312.

Figure 10A:
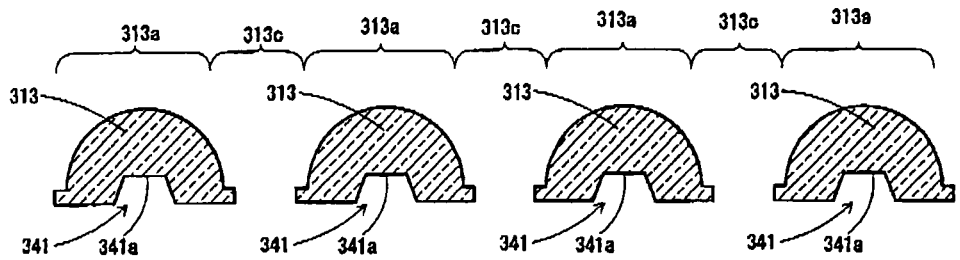
FIG. 10 is a schematic vertical cross sectional view for illustrating manufacturing processes in a sixth embodiment of the invention.

As shown in FIG. 10(A), the sealing member 313 is provided with a lens forming portion (main body) 313a having a concave portion 341 and a basal portion 313c located between the adjacent lens forming portions (main bodies) 313a and bonded to the substrate by pressure.

Figure 10B:
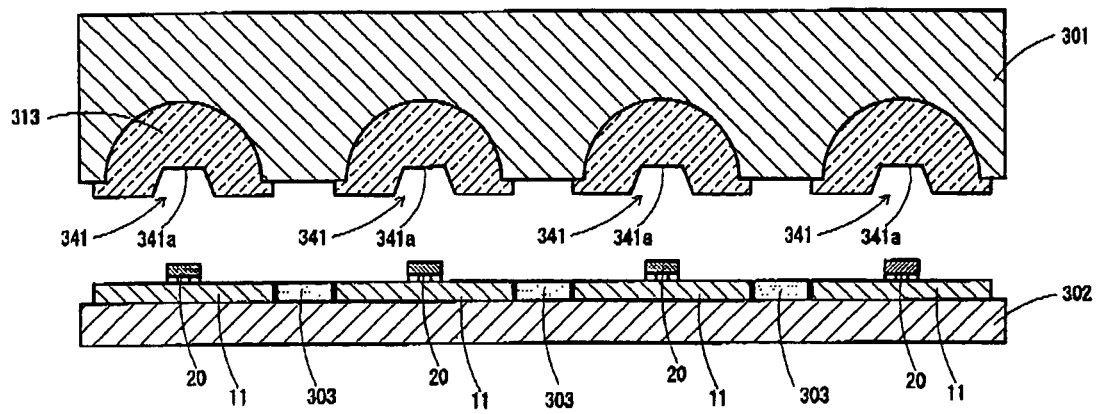
Figure 10C:
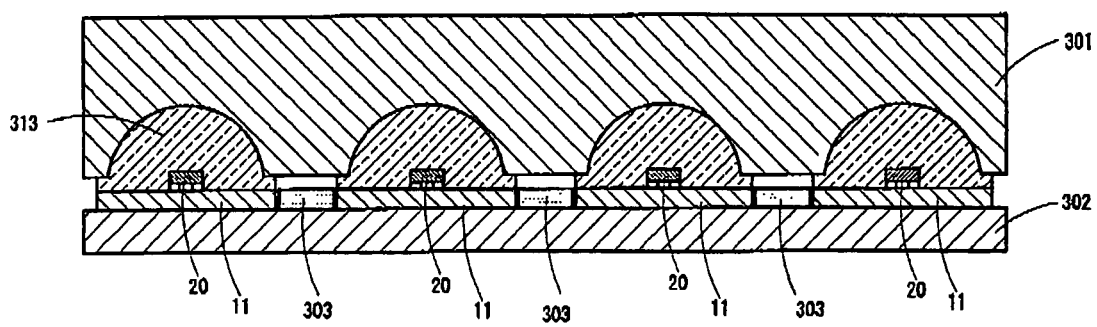
Figure 10D:
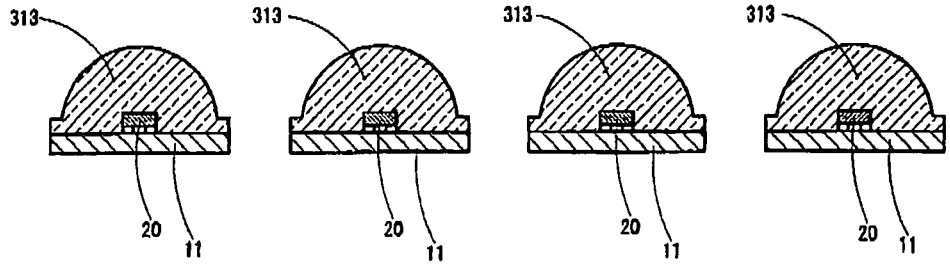
Figure 11A:
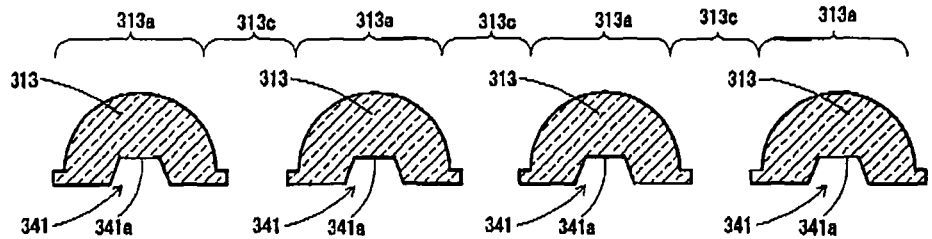
FIG. 11 is a schematic vertical cross sectional view for illustrating manufacturing processes in a seventh embodiment of the invention.
Figure 11B:
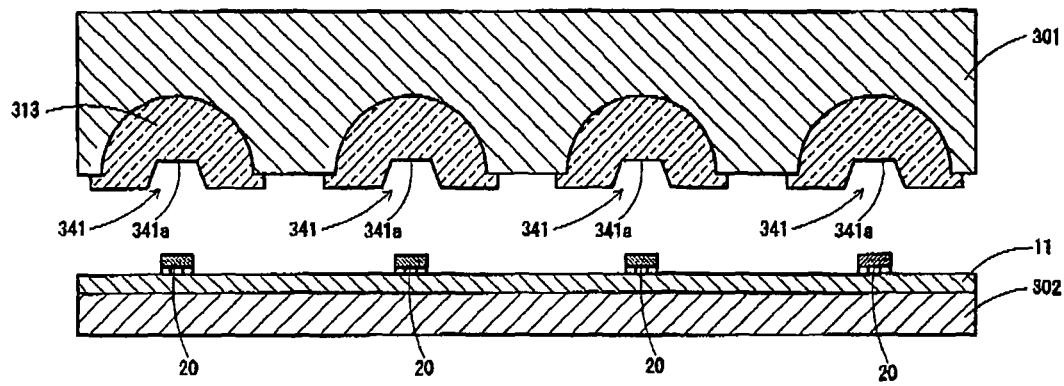
Figure 11C:
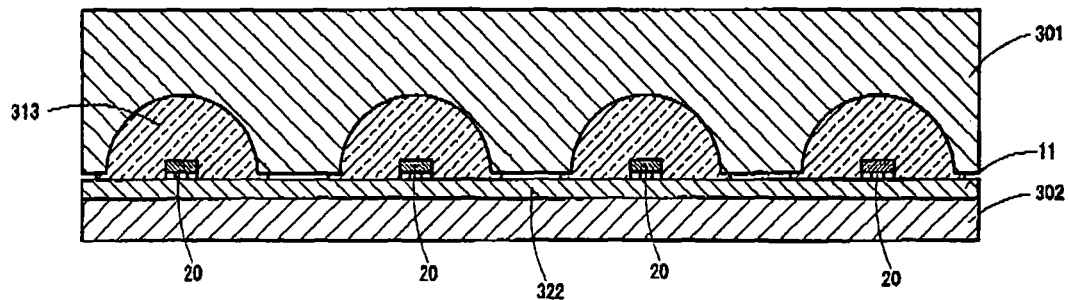
Figure 11D:
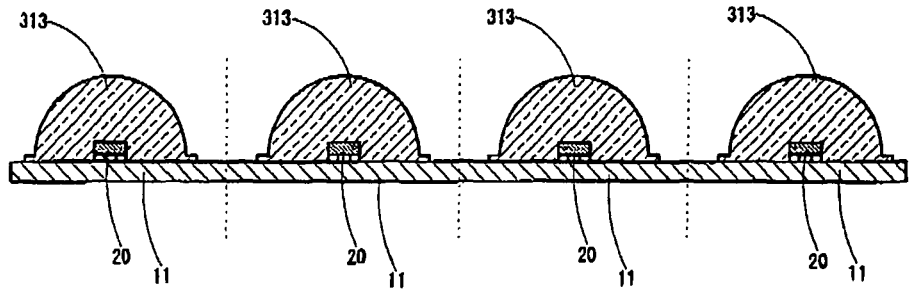

As shown in FIG. 10(B), the sealing member 313 is set on the upper die 301 for each separated substrate 11 in a state that the basal portions 313c are isolated. After that, plural LED lamps are formed by thermal compression bonding.

According to the sixth embodiment, since positioning of the sealing member 313 is allowed for each separated substrate 11, it is possible to prevent the misalignment.

Furthermore, since the substrate 11 and the sealing member 313 are separated for each LED element 20, it is not necessary to dice. As a result, it is not necessary to configure the arrangement of LED elements or height of sealing member (lens height) in light of a drawn amount of the dicing blade or a flange height of dicing apparatus, thereby improving the design freedom of the LED lamp.

Seventh Embodiment

FIG. 11 is a schematic vertical cross sectional view for illustrating manufacturing processes in a seventh embodiment.

The seventh embodiment is different from the third embodiment (see FIG. 7) in that the sealing member 313 is used instead of the sealing member 312.

According to the seventh embodiment, the influence of the difference in the amount of expansion/shrinkage between the substrate 11 and the sealing member 313 is reduced by separating and isolating the sealing member 313 at the basal portion 313c, and the generation of the cracks in the sealing member 313 is prevented.

Eighth Embodiment

FIG. 12 is a schematic vertical cross sectional view for illustrating manufacturing processes in an eighth embodiment.

A substrate housing portion 304a having a concave shape is provided in a lower die (underside die) 304, and is formed so that the size and the shape thereof are substantially the same as those of the substrate 11.

Figure 12A:
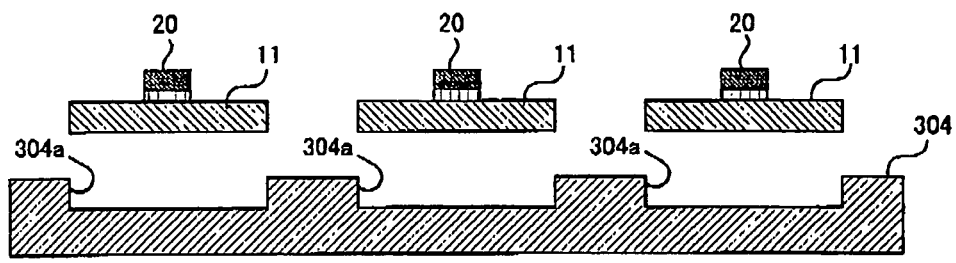
FIG. 12 is a schematic vertical cross sectional view for illustrating manufacturing processes in an eighth embodiment of the invention.
Figure 12B:
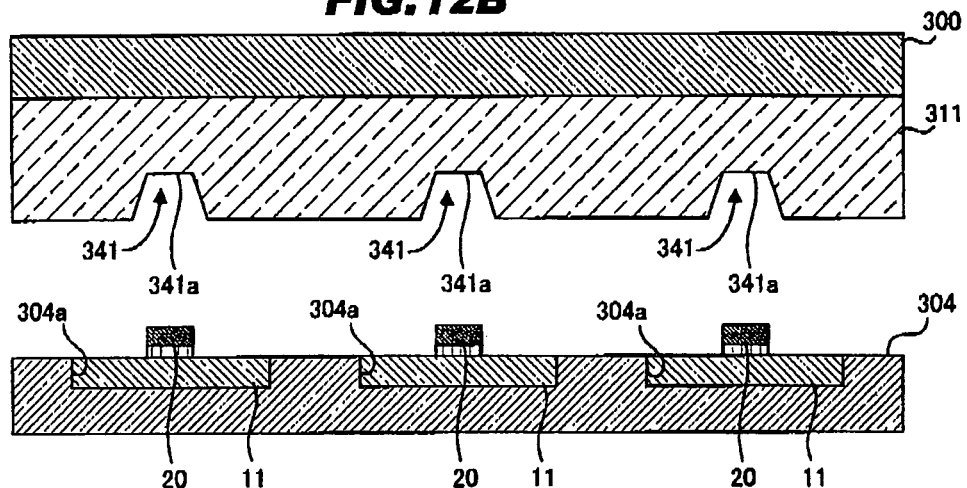

As shown in FIGS. 12(A) and 12(B), the substrate 11 divided by each LED element 20 is each set in the substrate housing portion 304a, and the separated substrates 11 are thus set on the lower die 304 in the state that the substrates 11 are separated each other.

Figure 12C:
Figure 12D:
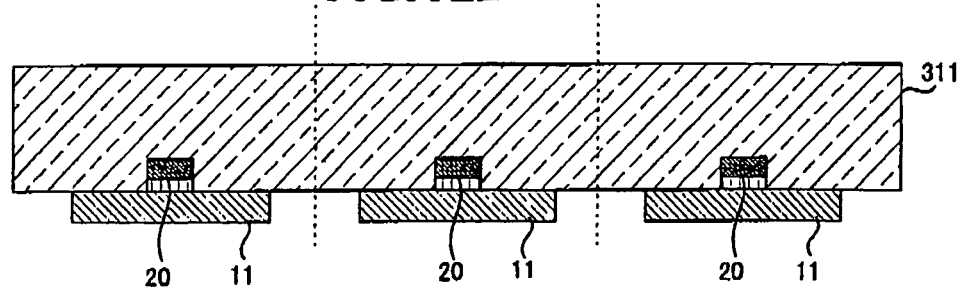

Then, as shown in FIG. 12(B), the sealing member 311 is arranged on the lower die 304 so that each concave portion 341a of the concave portion 341 encloses the corresponding LED element 20. After that, as shown in FIG. 12(C), the sealing member 311 is bonded to the substrate 11 by thermally compressing an upper die 300 on each substrate 11 side, and the forming surface 341a of the concave portion 341 is deformed along the LED element 20, thereby sealing the LED element 20.

According to the eighth embodiment, since the substrate 11 divided for each LED element 20 is each set in the substrate housing portion 304a, it is possible to separate and isolate the substrate 11, the influence of the difference in the amount of expansion/shrinkage between the substrate 11 and the sealing member 311 is reduced, and the generation of the cracks in the sealing member 311 is prevented.

Furthermore, it is possible to determine the position of the separated substrate 11 by the substrate housing portion 304a formed in the lower die 304.

In other words, the eighth embodiment also achieves the same effect as the fourth embodiment (see FIG. 8).

Ninth Embodiment

Figure 13A:
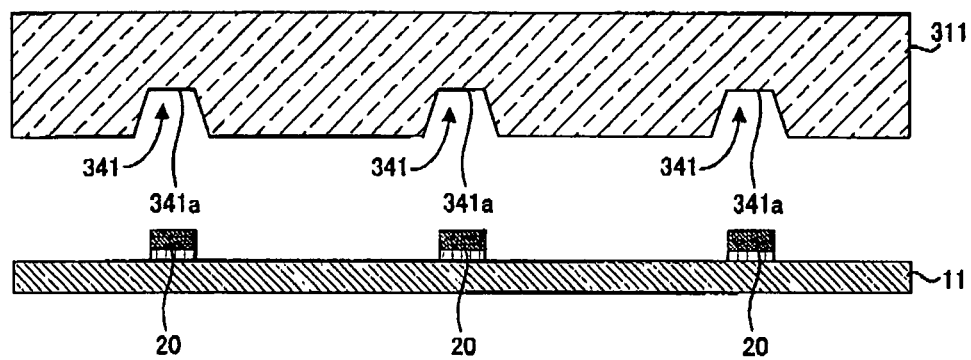
FIG. 13 is a schematic vertical cross sectional view for explaining a problem of the second embodiment of the invention.

FIG. 13 is a schematic vertical cross sectional view for explaining a problem of the second embodiment (see FIG. 6).

Figure 13B:
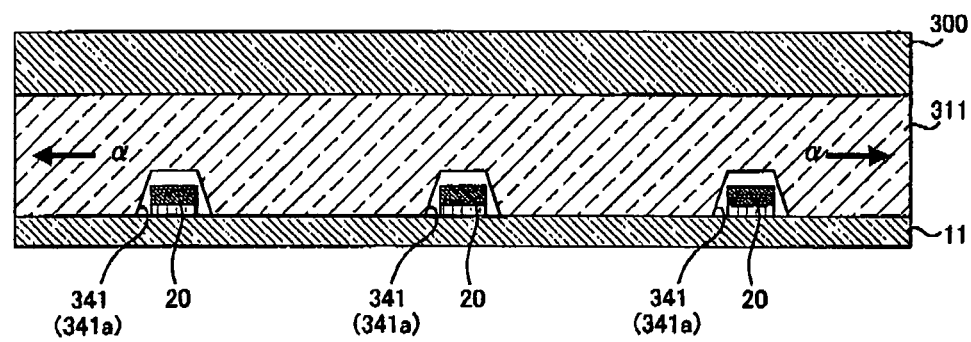

As shown in FIG. 13(B), in the sealing process (when the sealing member 311 is bonded to the substrate 11 by thermally compressing the upper die 300 on the substrate 11 side and the forming surface 341a of the concave portion 341 is made along the LED element 20), the softened sealing member 311 is going to move to a surface direction (a direction of arrow α in the figure) from the middle to peripheral edge portion of the substrate 11 (the upper die 300).

The movement of the sealing member 311 disturbs the deformation of the forming surface 341a of the concave portion 341 along the LED element 20.

Figure 13C:
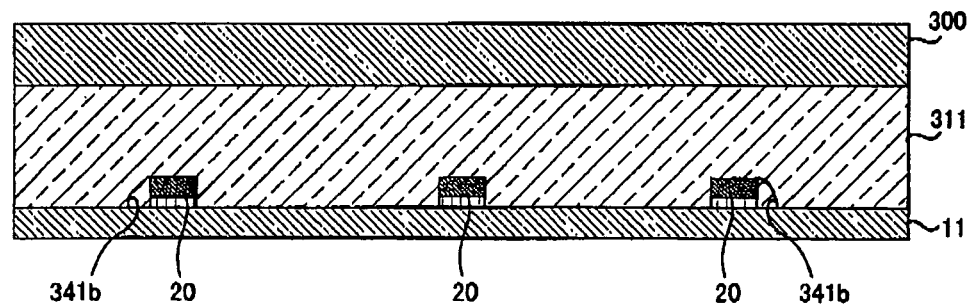

As a result, as shown in FIG. 13(C), the forming surface 341a of the concave portion 341 is not deformed along the LED element 20 at a portion located on a peripheral edge side of a side wall of a LED element 20, hence, there is a possibility that a hollow portion 341b generated by deformation of the concave portion 341 remains at the above-mentioned portion even after the sealing process.

FIG. 14 is a schematic vertical cross sectional view for illustrating manufacturing processes in a ninth embodiment.

The ninth embodiment is different from the second embodiment (see FIG. 6) in that an upper die 400 having a convex portion (a restricting means) 400a is used instead of the upper die 300.

Plural LED elements 20 are mounted on one substrate 11, the plural LED elements 20 are set on the lower die 302, and the convex portion 400a having a convex shape is vertically provided so as to each enclose the plural LED elements 20. In other words, the convex portion 400a formed by a lattice patterned side wall with constant height is vertically provided with respect to the LED elements 20 which are vertically and horizontally arranged and mounted in a square pattern at equal intervals.

Figure 14A:
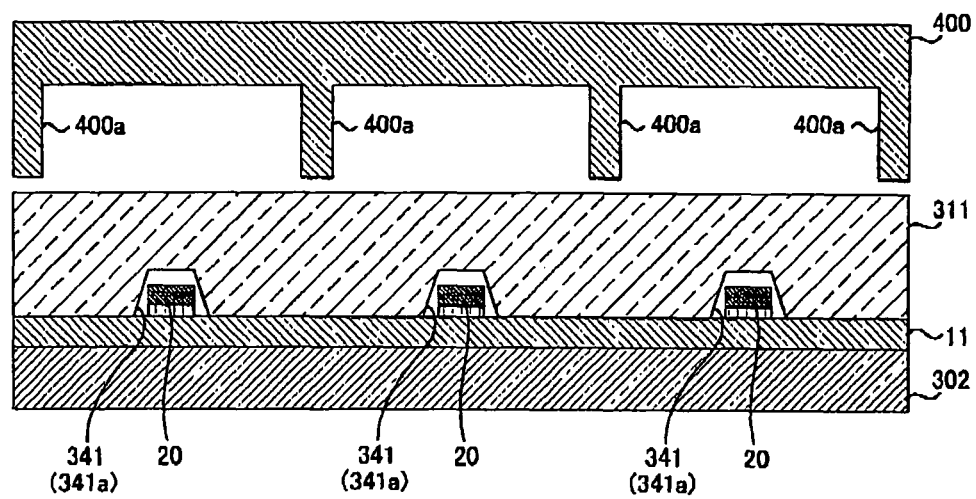
FIG. 14 is a schematic vertical cross sectional view for illustrating manufacturing processes in a ninth embodiment of the invention.

Firstly, as shown in FIG. 14(A), the substrate 11 is placed on the lower die 302, next, the sealing member 311 is arranged on the substrate 11 so that each concave portion 341a of the concave portion 341 encloses the corresponding LED element 20, and following this, the upper die 400 is set so that the convex portion 400a faces the LED element 20.

Figure 14B:
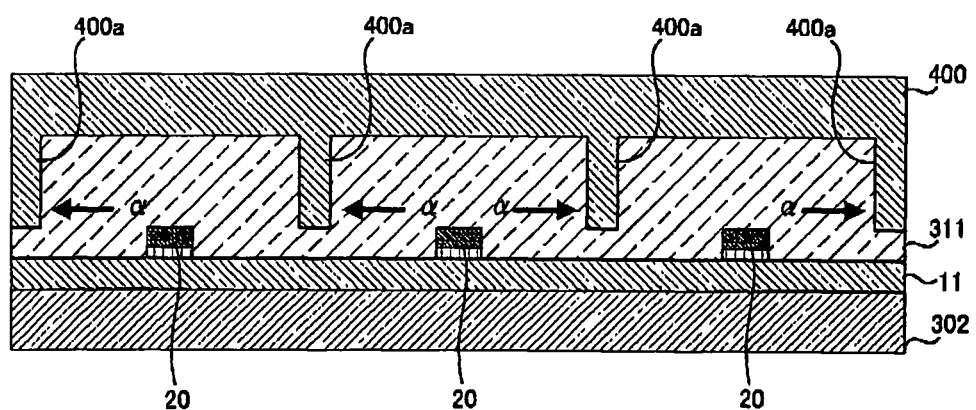

Then, as shown in FIG. 14(B), the sealing member 311 is bonded to the substrate 11 by thermally compressing the upper die 400 on the substrate 11 side, and the forming surface 341a of the concave portion 341 is deformed along the LED element 20, thereby sealing the LED element 20.

Figure 14C:
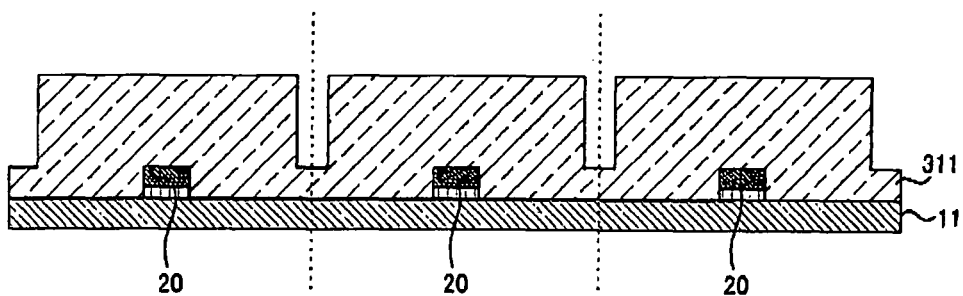

After that, as shown in FIG. 14(C), the integrated object composed of the substrate 11, the LED element 20 and the sealing member 311 is removed from the upper die 400 and the lower die 302, and plural individual LED lamps are formed by dicing for each sealed LED element 20 at positions indicated by dashed lines shown in the figure.

Here, in the sealing process (see FIG. 14(B)), since the convex portion 400a of the upper die 400 is inserted so as to dent into the upper surface of the softened sealing member 311 and the sealing member 311 is deformed along the inner wall surface of the upper die 400, even if the softened sealing member 311 is going to move to a surface direction (a direction of arrow α in the figure) from the middle to peripheral edge portion of the substrate 11 (each of the upper dies 400 and 302), the movement of the sealing member 311 is restricted by the convex portion 400a.

As a result, in the ninth embodiment, since the movement of the sealing member 311 is restricted and prevented for each individual LED element 20 by the convex portion 400a which each encloses the LED element 20, it is possible to surely deform the forming surface 341a of the concave portion 341 along the LED element 20 and there is no possibility that the hollow portion 341b in the sealing member 311 as shown in FIG. 13(C) is generated, thereby surely sealing the LED element 20.

In other words, according to the ninth embodiment, it is possible to solve the problem of the second embodiment (see FIG. 6) shown in FIG. 13.

For the convex portion 400a, the optimum size and shape may be experimentally found so that the above-mentioned function and effect are surely obtained.

In addition, the temperature of the upper die 400 can be set by experimentally finding an optimum temperature range so that the above-mentioned function and effect are surely obtained, and for example, it may be set within a temperature range which is lower than that of the lower die 302 by the predetermined temperature.

Tenth Embodiment

Figure 15A:
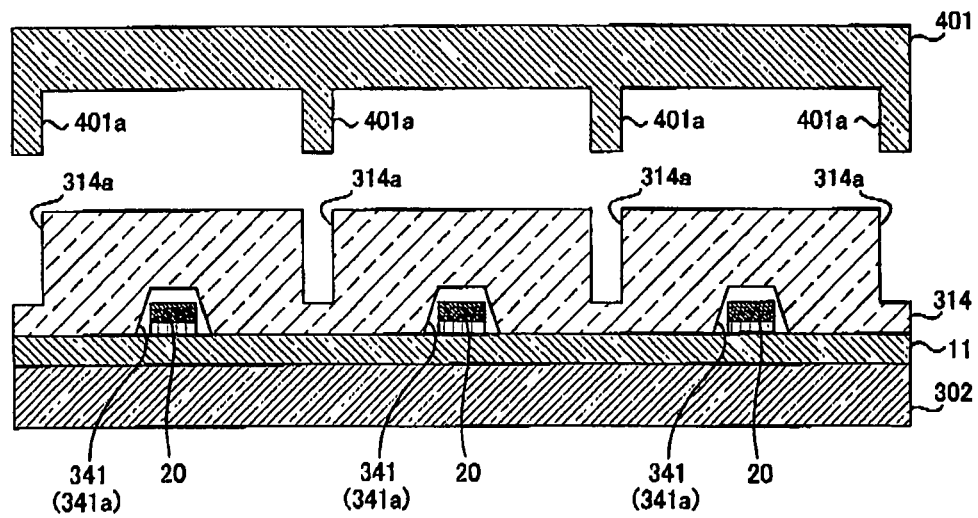
FIG. 15 is a schematic vertical cross sectional view for illustrating manufacturing processes in a tenth embodiment of the invention.
Figure 15B:
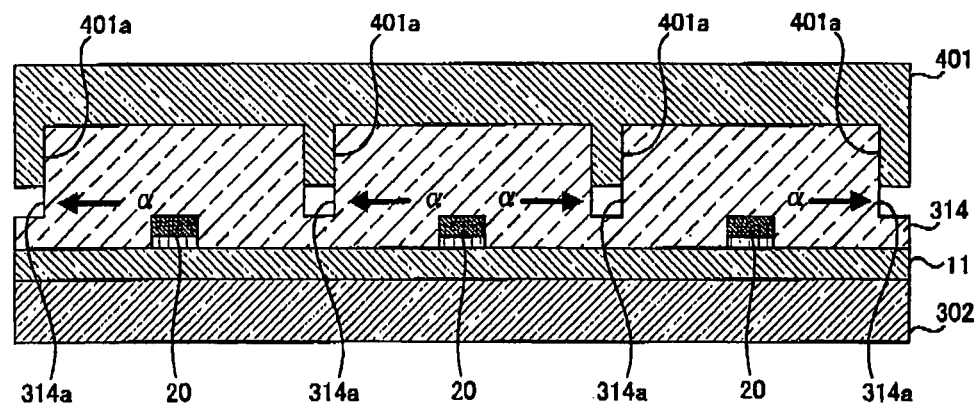
Figure 15C:
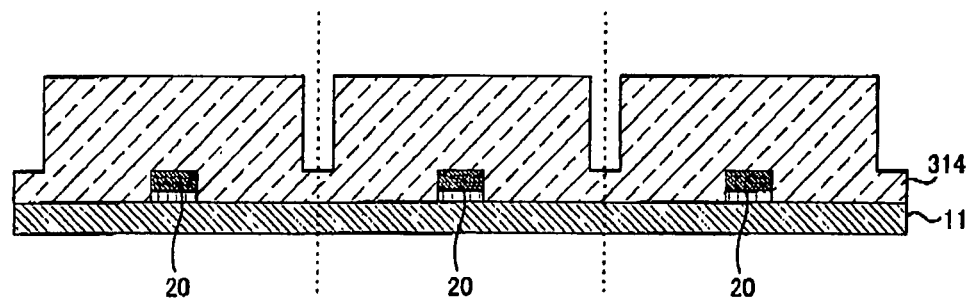

FIG. 15 is a schematic vertical cross sectional view for illustrating manufacturing processes in a tenth embodiment.

The tenth embodiment is different from the ninth embodiment (see FIG. 14) in that (c) an upper die 401 having a convex portion (a restricting means) 401a is used instead of the upper die 400 having the convex portion 400a and (d) a sealing member 314 in which a contact avoidance portion 314a for avoiding contact with a tip portion of the convex portion 401a is formed is used instead of the sealing member 311.

The convex portion 401a has the same configuration as the convex portion 400a except that the height thereof is lower than that of the convex portion 400a.

The contact avoidance portion 314a having a convex portion is pierced at a position corresponding to the convex portion 401a, the shape and size thereof are formed so as to match the convex portion 401a, and the depth thereof is formed larger than the height of the convex portion 401a.

A sealing member 314 is formed of the same material as the sealing member 311. In addition, the contact avoidance portion 314a may be formed by using any methods (e.g., molding, cutting or etching, etc.).

Firstly, as shown in FIG. 15(A), the substrate 11 is placed on the lower die 302, next, the sealing member 314 is arranged on the substrate 11 so that each concave portion 341a of the concave portion 341 encloses the corresponding LED element 20, and following this, the upper die 401 is set so that the convex portion 401a faces the LED element 20.

Then, as shown in FIG. 15(B), the sealing member 314 is bonded to the substrate 11 by thermally compressing the upper die 401 on the substrate 11 side, and the forming surface 341a of the concave portion 341 is deformed along the LED element 20, thereby sealing the LED element 20.

Here, in the sealing process (see FIG. 15(B)), since the sealing member 314 is deformed along the inner wall surface of the upper die 401 after the convex portion 401a of the upper die 401 is inserted into the contact avoidance portion 314a of the sealing member 314, even if the softened sealing member 314 is going to move to a surface direction (a direction of arrow α in the figure) from the middle to peripheral edge portion of the substrate 11 (each of the dies 401 and 302), the movement of the sealing member 314 is restricted by the convex portion 401a.

As a result, the same effect as the ninth embodiment (see FIG. 14) is achieved by the tenth embodiment In the meantime, in the ninth embodiment (see FIG. 14), the temperature of the upper die 400 is set lower than the lower die 302 in order to prevent the sealing member 311 from adhering to the upper die 400, however, since the convex portion 400a of the upper die 400 is inserted so as to dent into the upper surface of the softened sealing member 311 in the sealing process (see FIG. 14(B)), there is a possibility that the tip portion of the convex portion 401a is bonded to the sealing member 311 and the sealing member 311 cannot be pulled out from the upper die 400.

However, in the tenth embodiment, since the contact avoidance portion 314a is formed in the sealing member 314 in the sealing process (see FIG. 15(B)) in addition to the low height of the convex portion 401a of the upper die 400, the contact of the tip portion of the convex portion 401a with the inner bottom surface of the contact avoidance portion 314a is avoided. Hence, it is possible to prevent the tip portion of the convex portion 401a from adhering to the scaling member 314, and it is thereby possible to easily pull out the sealing member 314 from the upper die 401.

For the convex portion 401a and the contact avoidance portion 314a, the optimum size and shape may be experimentally found so that the above-mentioned function and effect are surely obtained.

Eleventh Embodiment

FIG. 16 is a schematic vertical cross sectional view for illustrating manufacturing processes in an eleventh embodiment.

The eleventh embodiment is different from the ninth embodiment (see FIG. 14) in that (e) a lower die (underside die) 305 having a substrate housing portion 304a and a convex portion (a restricting means) 305a is used instead of the lower die 302 and (f) the upper die 300 is used instead of the upper die 400.

The substrate housing portion 304a of the lower die 305 has the same configuration as the substrate housing portion 304a of the lower die 304 in the eighth embodiment (see FIG. 12).

The convex portion 305a having a convex shape is vertically provided on the lower die 305 at a portion located between the contact avoidance portions 314a.

Figure 16A:
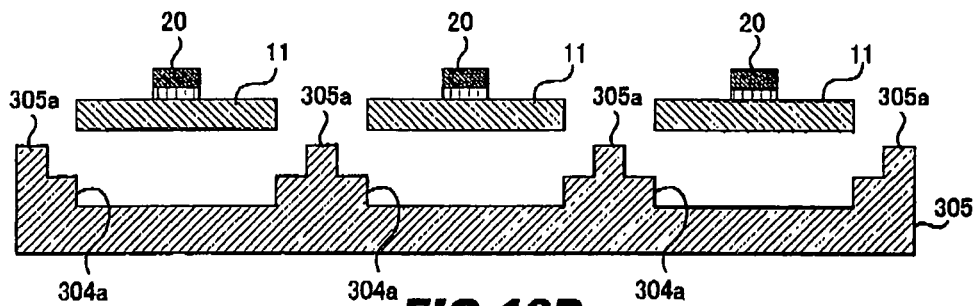
FIG. 16 is a schematic vertical cross sectional view for illustrating manufacturing processes in an eleventh embodiment of the invention.
Figure 16B:
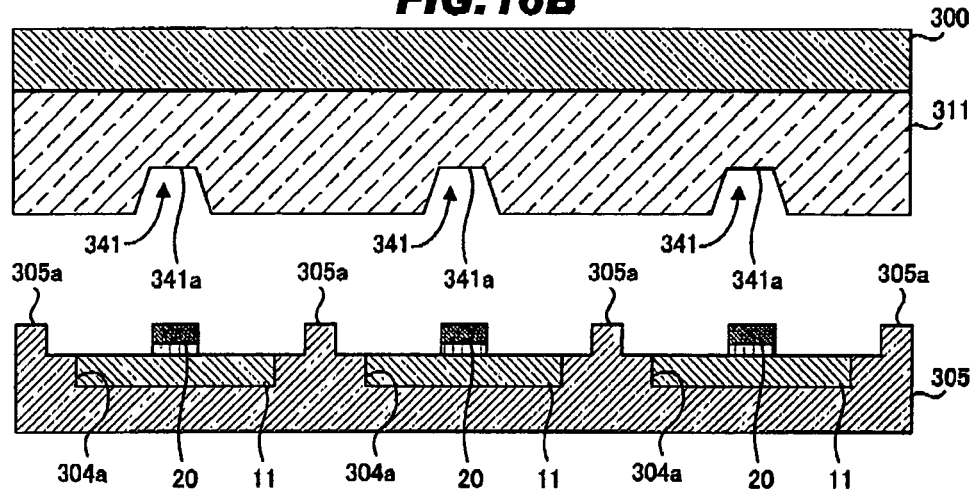

Firstly, as shown in FIGS. 16(A) and 16(B), the substrate 11 divided for each LED element 20 is each set in the substrate housing portion 304a, and the separated substrates 11 are thus set on the lower die 305 in the state that the substrates 11 are separated each other. Thus, plural LED elements 20 are set on the lower die 305 such that the convex portion 305a is vertically provided so as to each enclose the plural LED elements 20. In other words, the convex portion 305a formed by a lattice patterned side wall with constant height is vertically provided with respect to the LED elements 20 which are vertically and horizontally arranged and mounted in a square pattern at equal intervals.

Figure 16C:
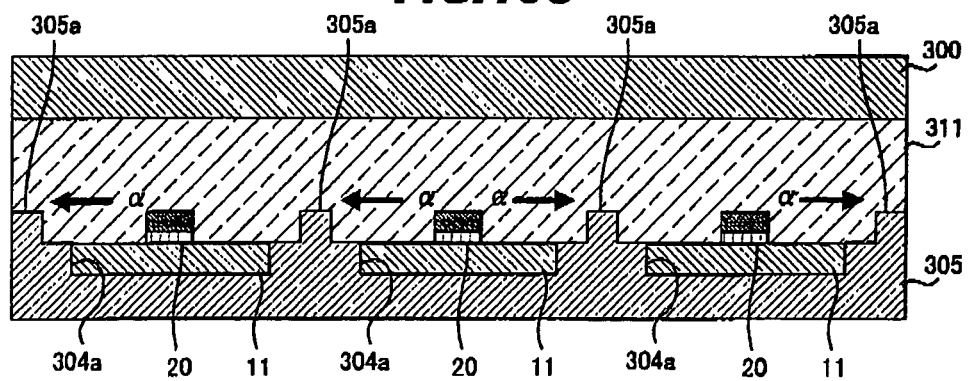

Then, as shown in FIG. 16(C), the sealing member 311 is bonded to the substrate 11 by thermally compressing the upper die 300 on the substrate 11 side, and the forming surface 341a of the concave portion 341 is deformed along the LED element 20, thereby sealing the LED element 20.

Figure 16D:
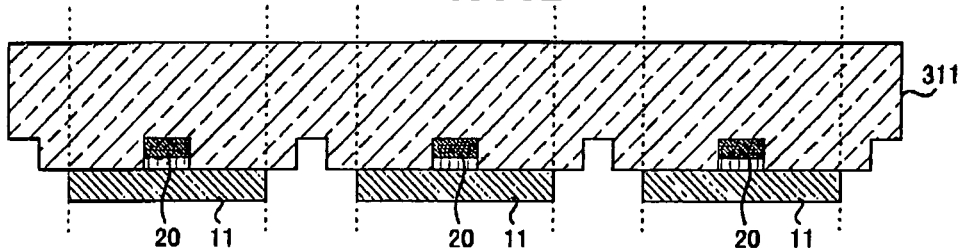

After that, as shown in FIG. 16(D), the integrated object composed of the substrate 11, the LED element 20 and the sealing member 311 is removed from the upper die 300 and the lower die 305, and plural individual LED lamps are formed by dicing for each sealed LED element 20 at positions indicated by dashed lines shown in the figure.

Here, in the sealing process (see FIG. 16(C)), since the convex portion 305a of the lower die 305 is inserted so as to dent into the lower surface of the softened sealing member 311 and the sealing member 311 is deformed along the outer wall surface of the lower die 305, even if the softened sealing member 311 is going to move to a surface direction (a direction of arrow α in the figure) from the middle to peripheral edge portion of the substrate 11 (each of the dies 300 and 305), the movement of the sealing member 311 is restricted by the convex portion 305a.

As a result, in the eleventh embodiment, since the movement of the sealing member 311 is restricted and prevented for each individual LED element 20 by the convex portion 305a which each encloses the LED element 20, it is possible to surely deform the forming surface 341a of the concave portion 341 along the LED element 20 and there is no possibility that the hollow portion 341b in the sealing member 311 as shown in FIG. 13(C) is generated, thereby surely sealing the LED element 20.

In other words, the same effect as the ninth embodiment (see FIG. 14) is achieved by the eleventh embodiment.

For the convex portion 305a, the optimum size and shape may be experimentally found so that the above-mentioned function and effect are surely obtained.

Twelfth Embodiment

FIG. 17 is a schematic vertical cross sectional view for illustrating manufacturing processes in a twelfth embodiment.

The twelfth embodiment is different from the eleventh embodiment (see FIG. 16) in that (g) the lower die 302 is used instead of the lower die 305 and (h) a spacer 306 having a convex portion (a restricting means) 306a is used.

The spacer 306 formed of the same material as the lower die 302 is placed on the lower die 302. The spacer 306 may be an integrated spacer or plural spacers combined together.

The spacer 306 is composed of a flat pedestal portion 306b and a convex portion 306a having a convex shape vertically provided on the pedestal portion 306b. The thickness of the pedestal portion 306b is substantially the same as that of the substrate 11.

Figure 17A:
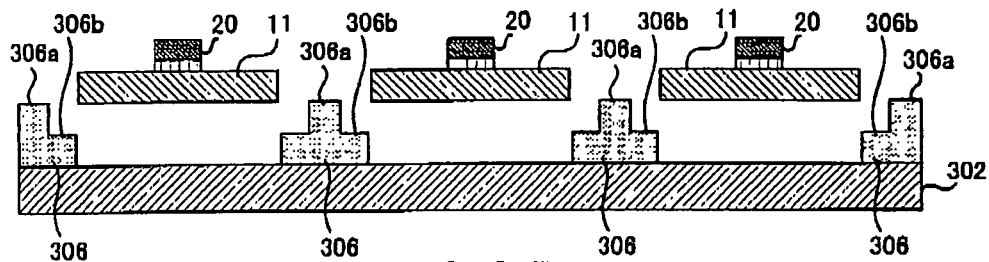
FIG. 17 is a schematic vertical cross sectional view for illustrating manufacturing processes in a twelfth embodiment of the invention.
Figure 17B:
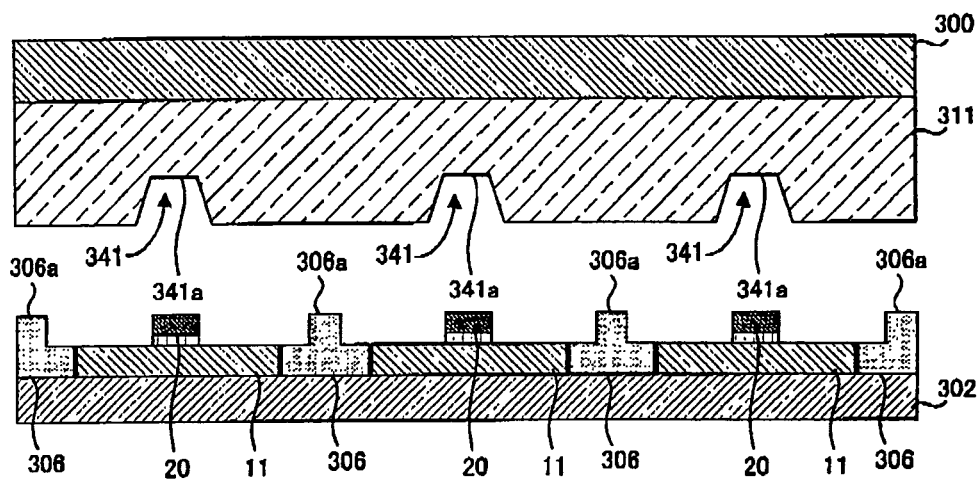

Firstly, as shown in FIG. 17(A), the separated substrates 11 are set on the lower die 302 in the state that the substrates 11 are separated each other. In other words, the spacer 306 is arranged between the substrates 11 in the state that the substrates 11 are separated, thus, the separated substrates 11 are positioned. Thus, plural LED elements 20 are set in the lower die 302 such that the convex portion 306a is vertically provided so as to each enclose the plural LED elements 20. In addition, the convex portion 306a formed by a lattice patterned side wall with constant height is vertically provided with respect to the LED elements 20 which are vertically and horizontally arranged and mounted in a square pattern at equal intervals.

Figure 17C:
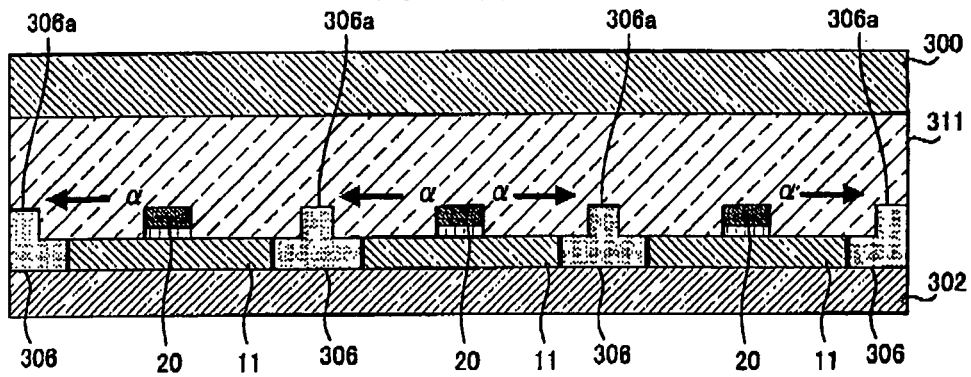

Then, as shown in FIG. 17(C), the sealing member 311 is bonded to the substrate 11 by thermally compressing the upper die 300 on the substrate 11 side, and the forming surface 341a of the concave portion 341 is deformed along the LED element 20, thereby sealing the LED element 20.

Figure 17D:
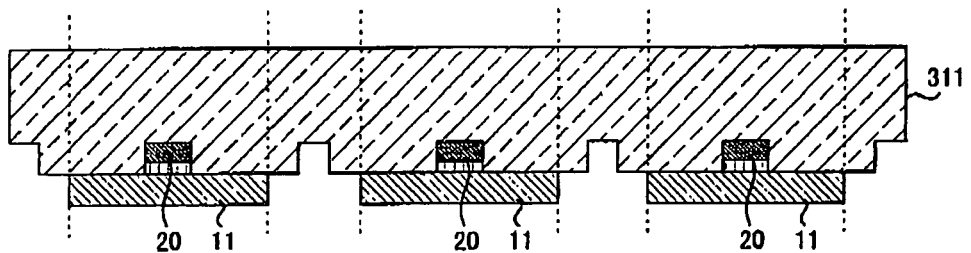

After that, as shown in FIG. 17(D), the integrated object composed of the substrate 11, the LED element 20 and the sealing member 311 is removed from the upper die 300 and the lower die 302, the spacer 306 is subsequently removed from the integrated object, and plural individual LED lamps are formed by dicing for each sealed LED element 20 at positions indicated by dashed lines shown in the figure.

Here, in the sealing process (see FIG. 17(C)), since the convex portion 306a of the spacer 306 is inserted so as to dent into the lower surface of the softened sealing member 311 and the sealing member 311 is deformed along the outer wall surface of the spacer 306, even if the softened sealing member 311 is going to move to a surface direction (a direction of arrow α in the figure) from the middle to peripheral edge portion of the substrate 11 (each of the dies 300 and 302), the movement of the sealing member 311 is restricted by the convex portion 306a.

As a result, in the twelfth embodiment, since the movement of the sealing member 311 is restricted and prevented for each individual LED element 20 by the convex portion 306a which each encloses the LED element 20, it is possible to surely deform the forming surface 341a of the concave portion 341 along the LED element 20 and there is no possibility that the hollow portion 341b in the sealing member 311 as shown in FIG. 13(C) is generated, thereby surely sealing the LED element 20.

In other words, the same effect as the eleventh embodiment (see FIG. 16) is achieved by the twelfth embodiment.

For the convex portion 306a, the optimum size and shape may be experimentally found so that the above-mentioned function and effect are surely obtained.

Thirteenth Embodiment

FIG. 18 is a schematic vertical cross sectional view for illustrating manufacturing processes in a thirteenth embodiment.

The thirteenth embodiment is different from the twelfth embodiment (see FIG. 17) in that a spacer 307 is used instead of the spacer 306 which is formed of the same material as the lower die 302.

The spacer 307 has the same size and shape as the spacer 306, and is composed of the pedestal portion 306b and the convex portion 306a.

Any material may be used for the spacer 307 as long as the material has characteristics to be integrated with the softened sealing member 311 (e.g., the same material as the sealing member 311, various types of glasses, various types of ceramics and alumina, etc.).

Figure 18A:
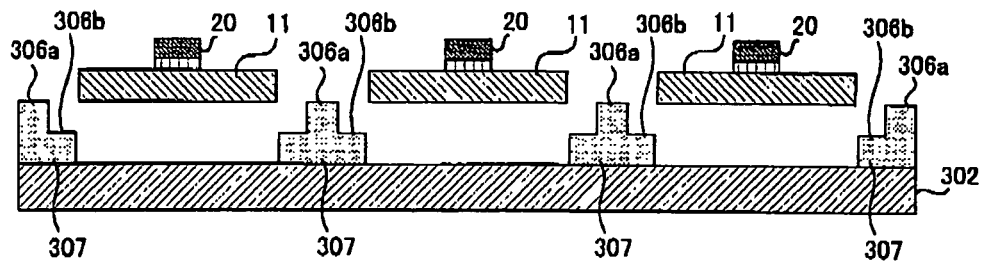
FIG. 18 is a schematic vertical cross sectional view for illustrating manufacturing processes in a thirteenth embodiment of the invention.
Figure 18B:
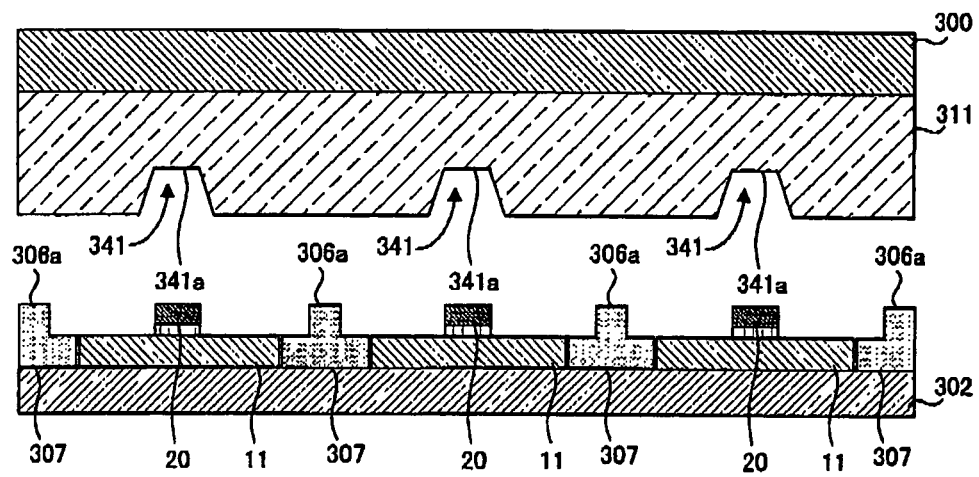
Figure 18C:
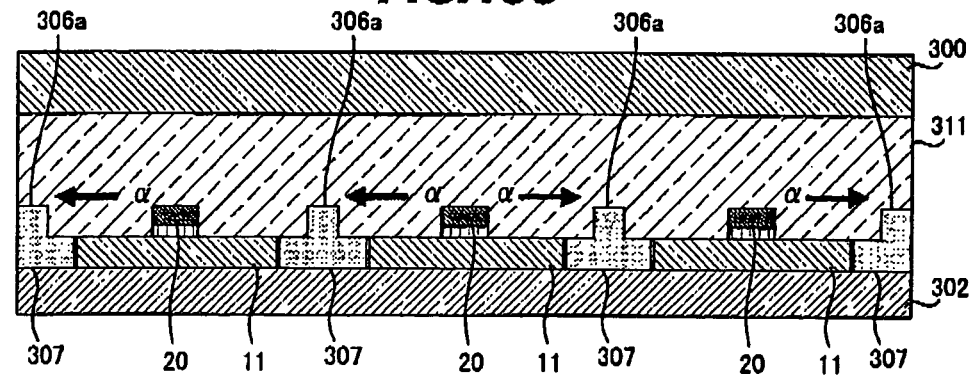

The same function and effect as the sealing process of the twelfth embodiment (see FIG. 17(C)) is obtained by the sealing process of the thirteenth embodiment (see FIG. 18(C)).

Figure 18D:
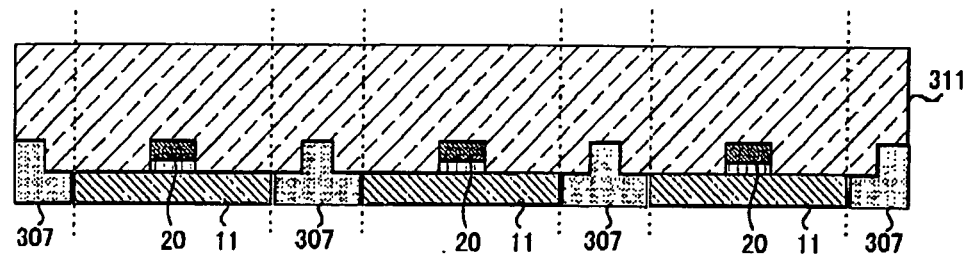

In addition, in the thirteenth embodiment, in order to integrated the spacer 307 with the softened sealing member 311, after the integrated object composed of the substrate 11, the LED element 20 and the sealing member 311 is removed from the upper die 300 and the lower die 302, plural individual LED lamps are formed by dicing for each seated LED element 20 at positions indicated by dashed lines shown in the figure, as shown in FIG. 18(D).

When the spacer 207 does not adversary affect optical characteristics of the LED lamp, the spacer 207 may remain in the completed LED lamp.

Fourteenth Embodiment

FIG. 19 is a schematic vertical cross sectional view for illustrating manufacturing processes in a fourteenth.

The fourteenth embodiment is different from the ninth embodiment (see FIG. 14) in that an upper die 402 having a convex portion (a restricting means) 402a is used instead of the upper die 400.

Plural LED elements 20 are mounted on one substrate 11, the plural LED elements 20 are set on the lower die 302, and the convex portion 402a having a convex shape is vertically provided along the peripheral edge of the upper die 402. In other words, the convex portion 402a with a constant-height peripheral wall is vertically provided so as to surround the outer peripheral edge of the upper die 402.

Figure 19A:
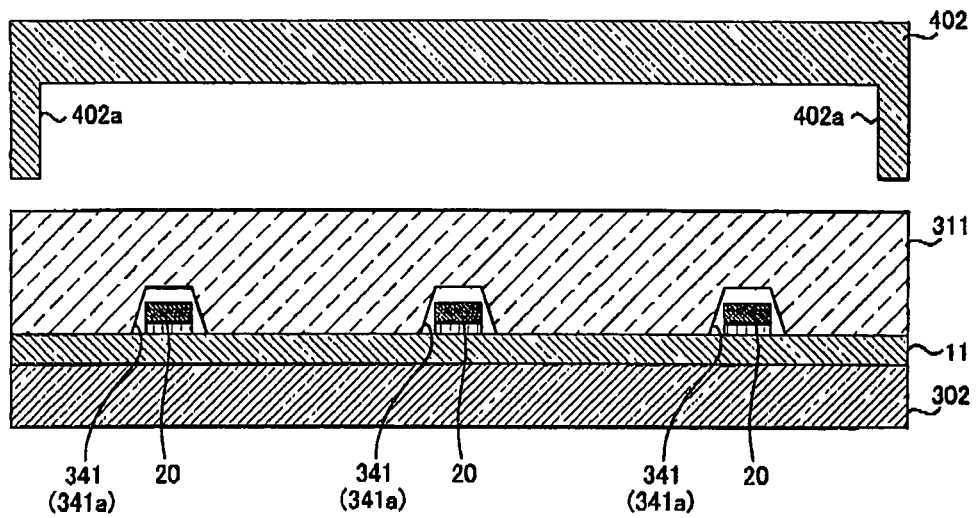
FIG. 19 is a schematic vertical cross sectional view for illustrating manufacturing processes in a fourteenth embodiment of the invention.

As shown in FIG. 19(A), the substrate 11 is placed on the lower die 302, next, the sealing member 311 is arranged on the substrate 11 so that each concave portion 341a of the concave portion 341 encloses the corresponding LED element 20, and following this, the upper die 402 is set so that the convex portion 402a faces the LED element 20.

Figure 19B:
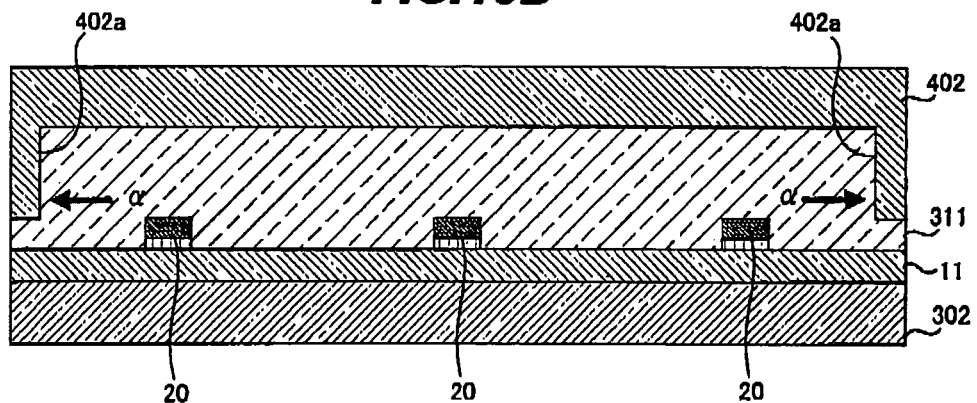

Then, as shown in FIG. 19(B), the sealing member 311 is bonded to the substrate 11 by thermally compressing the upper die 402 on the substrate 11 side, and the forming surface 341a of the concave portion 341 is deformed along the LED element 20, thereby sealing the LED element 20.

Figure 19C:
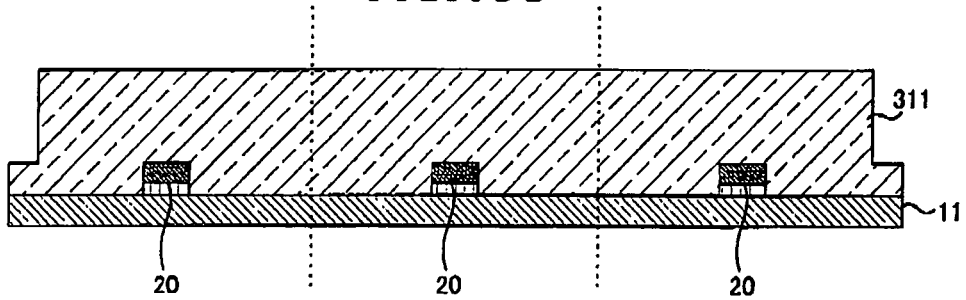

After that, as shown in FIG. 19(C), the integrated object composed of the substrate 11, the LED element 20 and the sealing member 311 is removed from the upper die 402 and the lower die 302, and plural individual LED lamps are formed by dicing for each sealed LED element 20 at positions indicated by dashed lines shown in the figure.

Here, in the sealing process (see FIG. 19(B)), since the convex portion 402a of the upper die 402 is inserted so as to dent into the upper surface of the softened sealing member 311 at the peripheral edge and the sealing member 311 is deformed along the inner wall surface of the upper die 402, even if the softened sealing member 311 is going to move to a surface direction (a direction of arrow α in the figure) from the middle to peripheral edge portion of the substrate 11 (each of the dies 402 and 302), the movement of the sealing member 311 is restricted by the convex portion 402a.

As a result, in the fourteenth embodiment, since the movement of the sealing member 311 is prevented by the convex portion 402a of the upper die 402, it is possible to surely deform the forming surface 341a of the concave portion 341 along the LED element 20 and there is no possibility that the hollow portion 341b in the sealing member 311 as shown in FIG. 13(C) is generated, thereby surely sealing the LED element 20.

In the meantime, although the softened sealing material 311 moves in a surface direction from the middle to peripheral edge portion of the substrate 11 (each of the dies 402 and 302), the movement of the sealing member 311 significantly occurs specifically at an outer peripheral edge portion of each of the dies 402 and 302, but hardly occurs at the middle portion thereof.

Therefore, even the upper die 402 in which the convex portion 402a is vertically provided only at the peripheral edge is used as described in the fourteenth embodiment, the effect relatively comparable to the ninth embodiment (the upper die 400 in which the convex portion 400a is vertically provided so as to each enclose the plural LED elements 20, see FIG. 14) is obtained.

In addition, according to the fourteenth embodiment, since it is possible to manufacture at low cost due to the simple structure of the upper die 402, it is possible to reduce the manufacturing cost of the LED lamp compared with the ninth embodiment (see FIG. 14).

For the convex portion 402a, the optimum size and shape may be experimentally found so that the above-mentioned function and effect are surely obtained.

Fifteenth Embodiment

FIG. 20 is a schematic vertical cross sectional view for illustrating manufacturing processes in a fifteenth embodiment.

The fifteenth embodiment is different from the eleventh embodiment (see FIG. 16) in that the substrate housing portion 304a and a lower die 308 having a convex portion (a restricting means) 308a is used instead of the lower die 305.

The substrate housing portion 304a of the lower die 308 has the same configuration as the substrate housing portion 304a of the lower die 305 in the eleventh embodiment (see FIG. 16).

The convex portion 308a is vertically provided along the peripheral edge of the lower die 308.

Figure 20A:
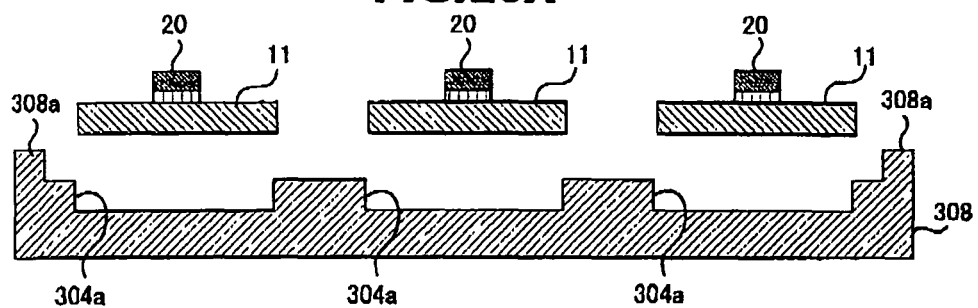
FIG. 20 is a schematic vertical cross sectional view for illustrating manufacturing processes in a fifteenth embodiment of the invention.
Figure 20B:
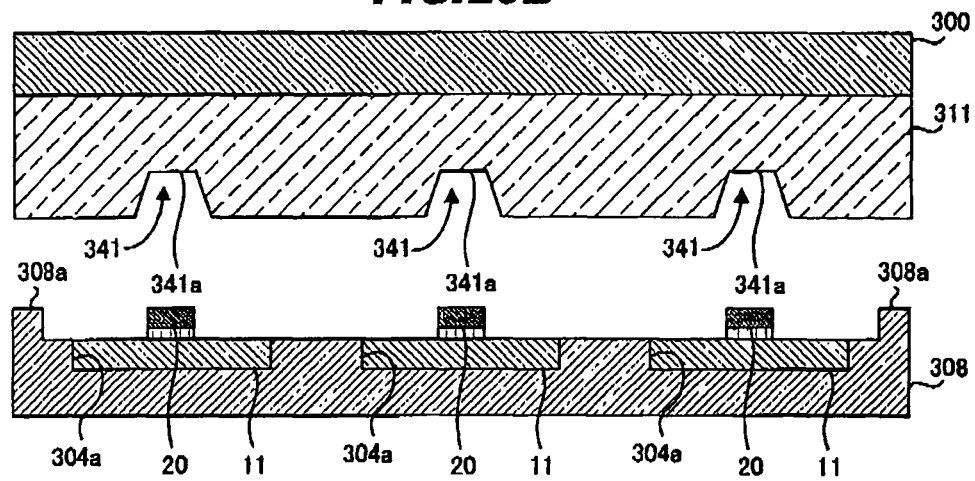

As shown in FIGS. 20(A) and 20(B), the substrate 11 divided for each LED element 20 is each set in the substrate housing portion 304a, and the separated substrates 11 are thus set on the lower die 308 in the state that the substrates 11 are separated each other. Thus, plural LED elements 20 are set in the lower die 308 such that the convex portion 308a is vertically provided along the peripheral edge of the lower die 308.

Figure 20C:
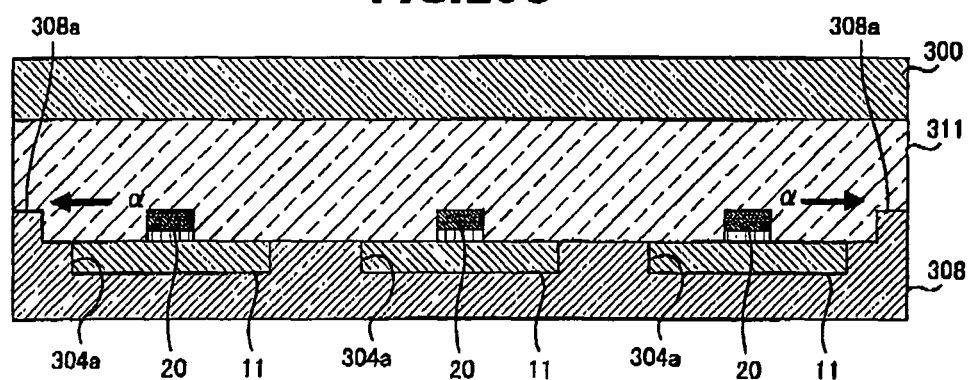

Then, as shown in FIG. 20(C), the sealing member 311 is bonded to the substrate 11 by thermally compressing the upper die 300 on the substrate 11 side, and the forming surface 341a of the concave portion 341 is deformed along the LED element 20, thereby sealing the LED element 20.

Figure 20D:
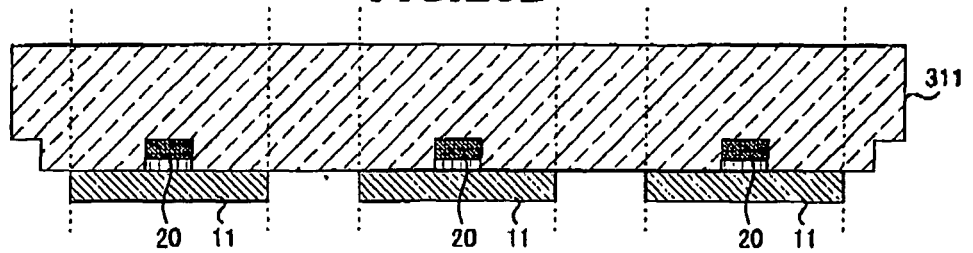

After that, as shown in FIG. 20(D), the integrated object composed of the substrate 11, the LED element 20 and the sealing member 311 is removed from the upper die 300 and the lower die 308, and plural individual LED lamps are formed by dicing for each sealed LED element 20 at positions indicated by dashed lines shown in the figure.

Here, in the sealing process (see FIG. 20(C)), since the convex portion 308a of the lower die 308 is inserted so as to dent into the lower surface of the softened sealing member 311 and the sealing member 311 is deformed along the outer wall surface of the lower die 308, even if the softened sealing member 311 is going to move to a surface direction (a direction of arrow α in the figure) from the middle to peripheral edge portion of the substrate 11 (each of the dies 300 and 308), the movement of the sealing member 311 is restricted by the convex portion 308a.

As a result, in the fifteenth embodiment, since the movement of the sealing member 311 is prevented by the convex portion 308a of the lower die 308, it is possible to surely deform the forming surface 341a of the concave portion 341 along the LED element 20 and there is no possibility that the hollow portion 341b in the sealing member 311 as shown in FIG. 13(C) is generated, thereby surely sealing the LED element 20.

In other words, although the softened sealing material 311 moves in a surface direction from the middle to peripheral edge portion of the substrate 11 (each of the dies 300 and 308), the movement of the sealing member 311 significantly occurs specifically at an outer peripheral edge portion of each of the dies 300 and 308, but hardly occurs at the middle portion thereof.

Therefore, even when the lower die 308 in which the convex portion 308a is vertically provided only at the peripheral edge is used as described in the fifteenth embodiment, the effect relatively comparable to the eleventh embodiment (the lower die 305 in which the convex portion 305a is vertically provided so as to each enclose the plural LED elements 20, see FIG. 16) is obtained.

In addition, according to the fifteenth embodiment, since it is possible to manufacture at low cost due to the simple structure of the lower die 308, it is possible to reduce the manufacturing cost of the LED lamp compared with the eleventh embodiment (see FIG. 16).

For the convex portion 308a, the optimum size and shape may be experimentally found so that the above-mentioned function and effect are surely obtained.

Sixteenth Embodiment

FIG. 21 is a schematic vertical cross sectional view for illustrating manufacturing processes in a sixteenth embodiment.

The sixteenth embodiment is different from the twelfth embodiment (see FIG. 17) in that a spacer 309 having a convex portion (a restricting means) 309a and the spacer 303 are used instead of the spacer 306 having the convex portion 306a.

Each of the spacers 303 and 309 formed of the same material as the lower die 302 is placed on the lower die 302. The spacers 303 and 309 may be an integrated spacer or plural spacers combined together.

The spacer 309 arranged at the peripheral edge portion of the lower die 302 is composed of a flat pedestal portion 309b and a convex portion 309a having a convex shape vertically provided on the pedestal portion 309b. The thickness of the pedestal portion 309b is substantially the same as that of the substrate 11.

Firstly, as shown in FIG. 21(A), the separated substrates 11 are set on the lower die 302 in the state that the substrates 11 are separated each other. In other words, the spacer 303 is arranged between the substrates 11 in the state that the substrates 11 are separated and the outer peripheral edge of each substrate 11 is surrounded by the spacer 309 arranged at the peripheral edge portion of the lower die 302, and thus, the separated substrates 11 are positioned. Thus, plural LED elements 20 are set on the lower die 302 such that the convex portion 309a of the spacer 309 is vertically provided along the peripheral edge of the lower die 302.

Then, as shown in FIG. 21(C), the sealing member 311 is bonded to the substrate 11 by thermally compressing the upper die 300 on the substrate 11 side, and the forming surface 341a of the concave portion 341 is deformed along the LED element 20, thereby sealing the LED element 20.

After that, as shown in FIG. 21(D), the integrated object composed of the substrate 11, the LED element 20 and the sealing member 311 is removed from the upper die 300 and the lower die 302, and plural individual LED lamps are formed by dicing for each sealed LED element 20 at positions indicated by dashed lines shown in the figure.

Here, in the sealing process (see FIG. 21(C)), since the convex portion 309a of the spacer 309 is inserted so as to dent into the lower surface of the softened sealing member 311 at the peripheral edge and the sealing member 311 is deformed along the outer wall surfaces of the spacers 303 and 309, even if the softened sealing member 311 is going to move to a surface direction (a direction of arrow α in the figure) from the middle to peripheral edge portion of the substrate 11 (each of the dies 300 and 302), the movement of the sealing member 311 is restricted by the convex portion 309a.

As a result, in the sixteenth embodiment, since the movement of the sealing member 311 is prevented by the convex portion 309a of the spacer 309, it is possible to surely deform the forming surface 341a of the concave portion 341 along the LED element 20 and there is no possibility that the hollow portion 341b in the sealing member 311 as shown in FIG. 13(C) is generated, thereby surely sealing the LED element 20.

In other words, although the softened sealing material 311 moves in a surface direction from the middle to peripheral edge portion of the substrate 11 (each of the dies 300 and 302), the movement of the sealing member 311 significantly occurs specifically at an outer peripheral edge portion of each of the dies 300 and 302, but hardly occurs at the middle portion thereof.

Therefore, even when the spacer 309 in which the convex portion 309a is vertically provided only at the peripheral edge of the lower die 308 is used as described in the sixteenth embodiment, the effect relatively comparable to the twelfth embodiment (the spacer 306 in which the convex portion 306a is vertically provided so as to each surround the plural LED elements 20, see FIG. 17) is obtained.

For the convex portion 309a, the optimum size and shape may be experimentally found so that the above-mentioned function and effect are surely obtained.

Seventeenth Embodiment

Figure 22A:
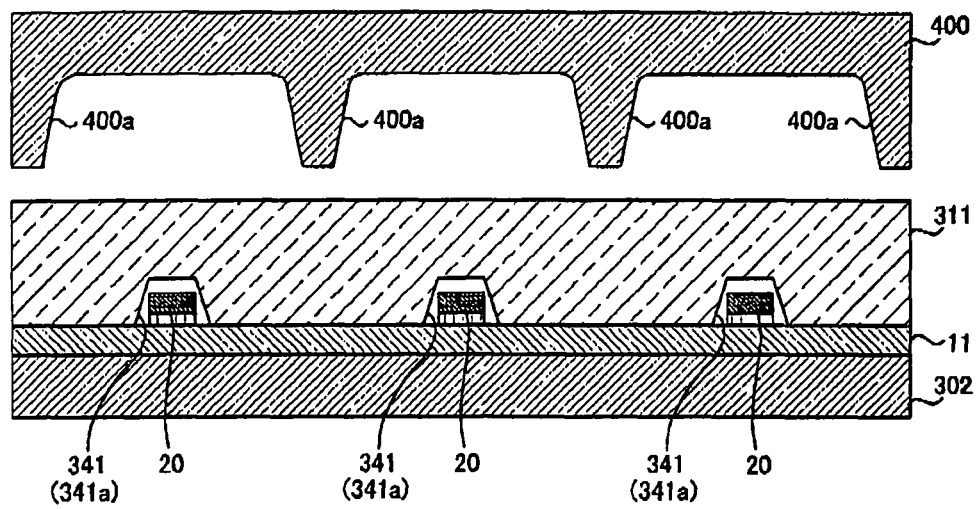
FIG. 22 is a schematic vertical cross sectional view for illustrating manufacturing processes in a seventeenth embodiment of the invention.
Figure 22B:
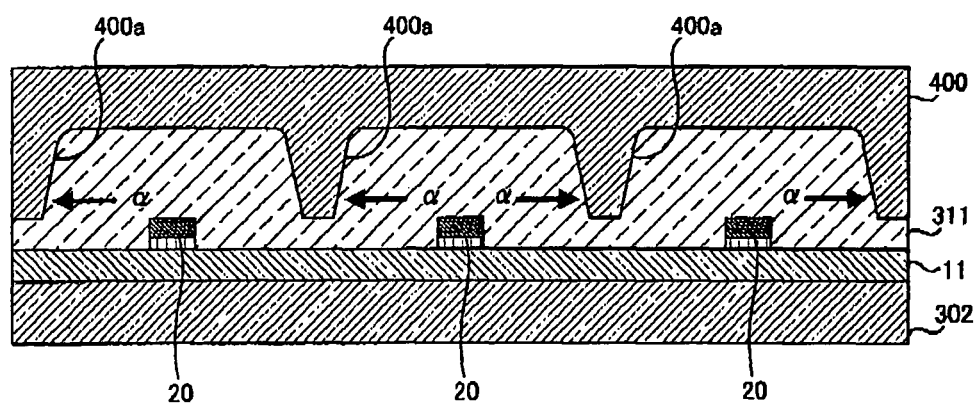
Figure 22C:
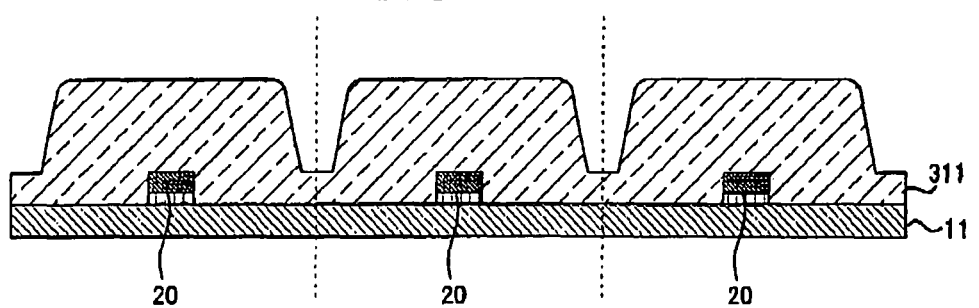

FIG. 22 is a schematic vertical cross sectional view for illustrating manufacturing processes in a seventeenth embodiment.

The seventeenth embodiment is different from the ninth embodiment (see FIG. 14) in that the width of the convex portion 400a expands toward a proximal end where the upper die 400 is connected thereto, and an R-shape is provided on the proximal end of the convex portion 400a. In other words, a vertical cross sectional shape of the concave portion surrounded by the convex portion 400a is formed in a trapezoidal shape which expands toward the opening side, and an R-shape is provided at a corner portion of the short side of the trapezoidal shape.

Therefore, according to the seventeenth embodiment, the sealing member 311 can be easily pulled out of the upper die 400 compared with the ninth embodiment (see FIG. 14).

Eighteenth Embodiment

Figure 23A:
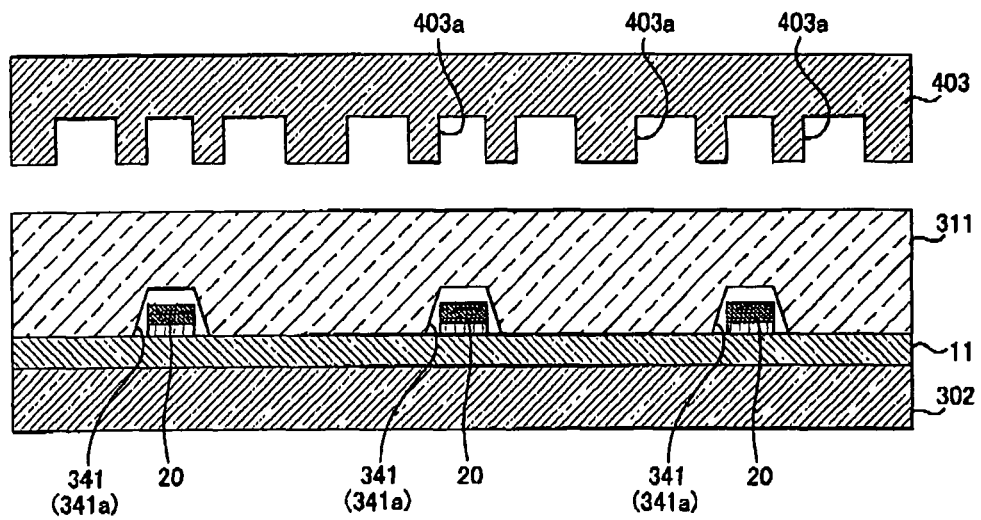
FIG. 23 is a schematic vertical cross sectional view for illustrating manufacturing processes in an eighteenth embodiment of the invention.
Figure 23B:
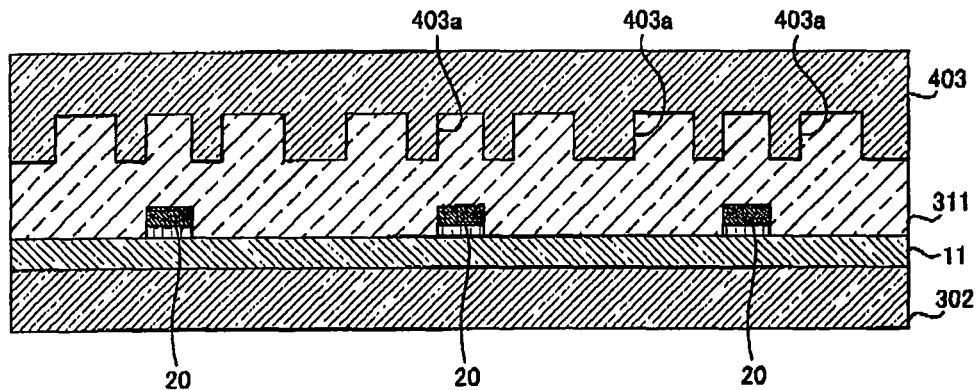

FIG. 23 is a schematic vertical cross sectional view for illustrating manufacturing processes in an eighteenth embodiment.

The eighteenth embodiment is different from the ninth embodiment (see FIG. 14) in that an upper die 403 in which multiple convex portions (restricting means) 403a having a variety of convex shapes are vertically provided is used instead of the upper die 400.

Figure 23C:
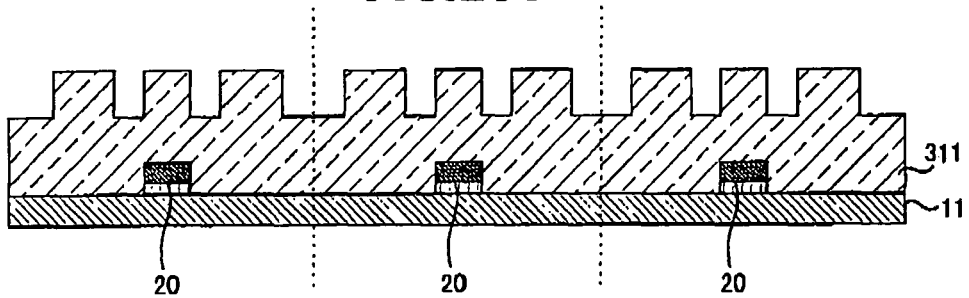

In the sealing process of the eighteenth embodiment (see FIG. 23(C)), the multiple convex portions 403a achieve the same function and effect as the convex portion 400a in the sealing process of the ninth embodiment (see FIG. 14(C)).

For the convex portion 403a, the optimum size, shape, number and arrangement position may be experimentally found so that the above-mentioned function and effect are surely obtained.

Nineteenth Embodiment

Figure 24A:
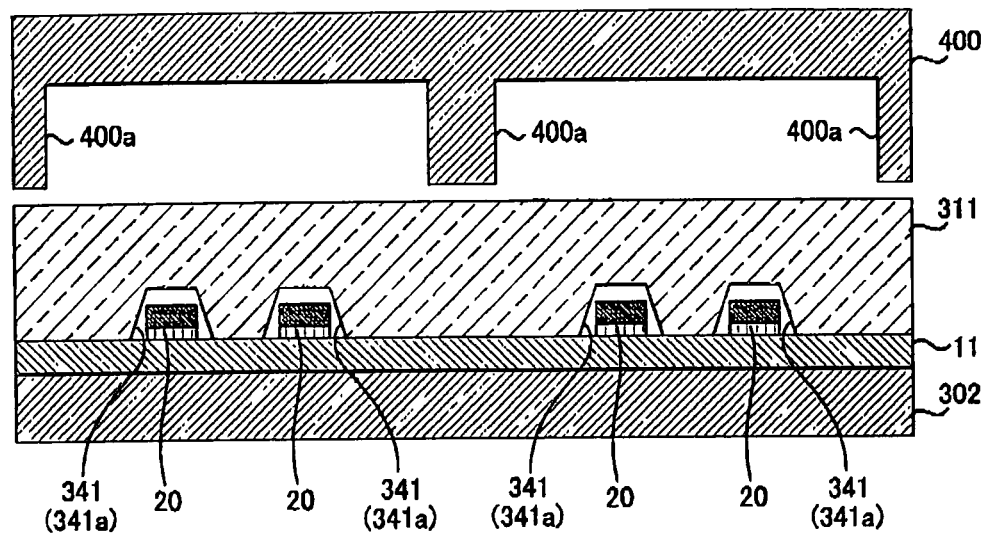
FIG. 24 is a schematic vertical cross sectional view for illustrating manufacturing processes in a nineteenth embodiment of the invention.
Figure 24B:
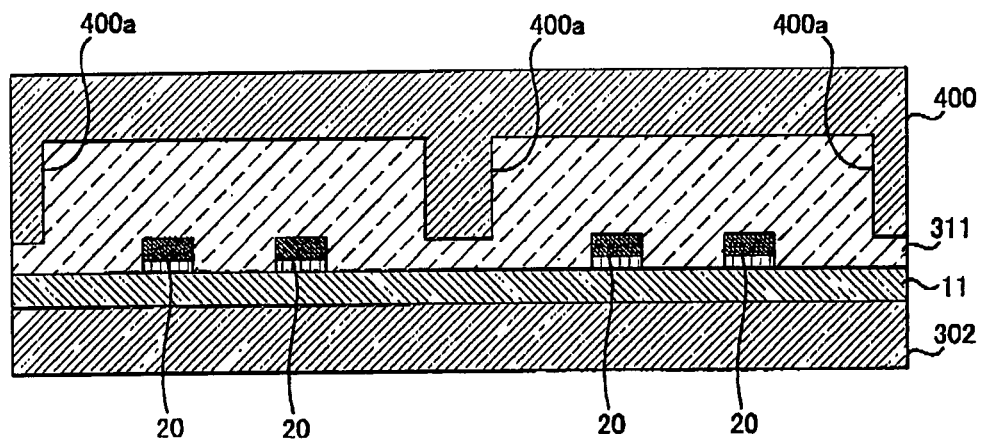
Figure 24C:
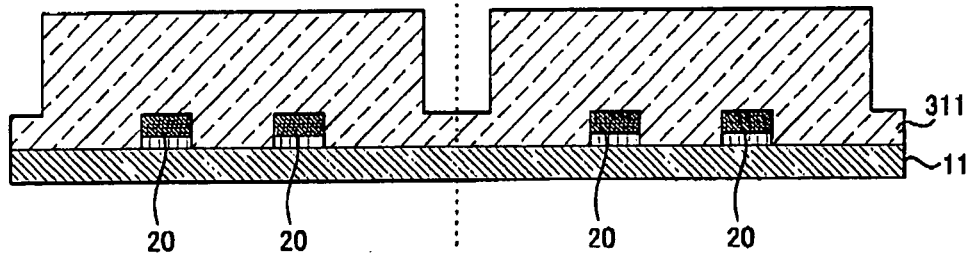

FIG. 24 is a schematic vertical cross sectional view for illustrating manufacturing processes in a nineteenth embodiment.

The nineteenth embodiment is different from the ninth embodiment (see FIG. 14) in that two LED elements 20 are sealed in one LED lamp.

Figure 25A:
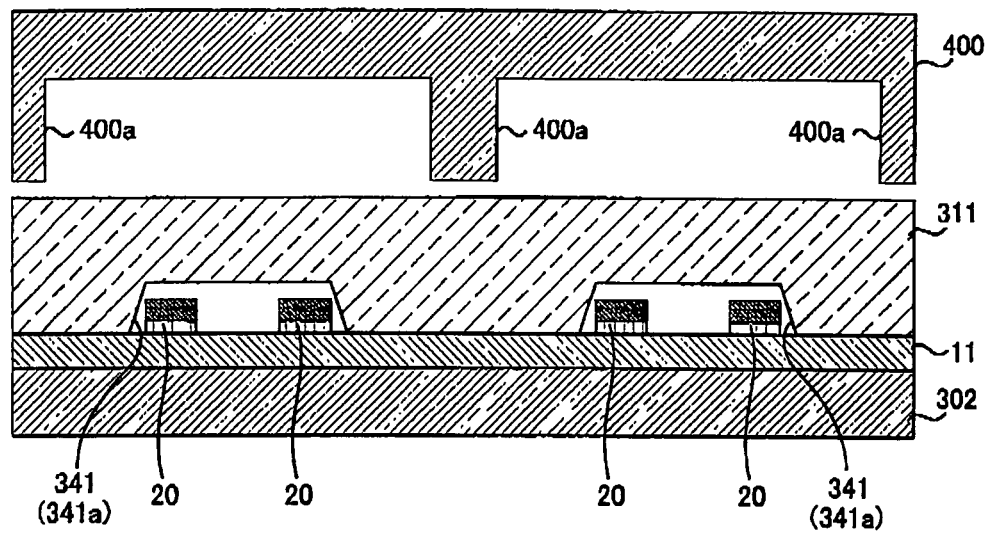
FIG. 25 is a schematic vertical cross sectional view for illustrating manufacturing processes in a first modification of the nineteenth embodiment.
Figure 25B:
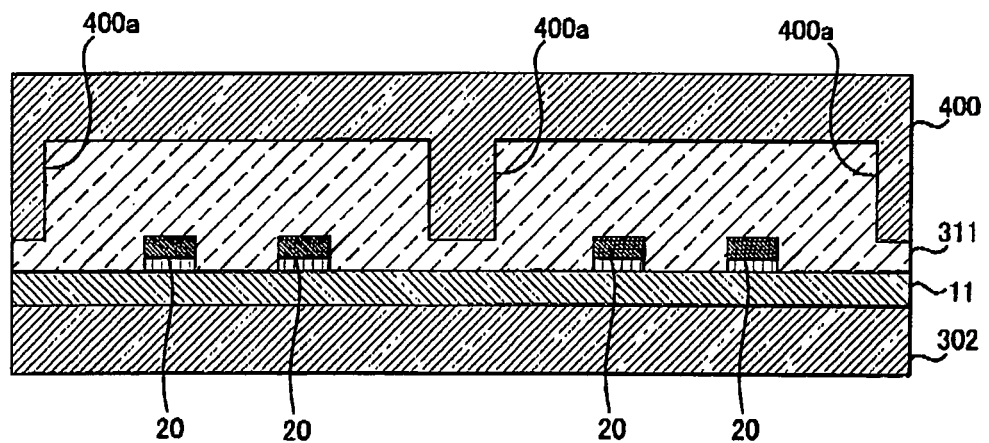
Figure 25C:
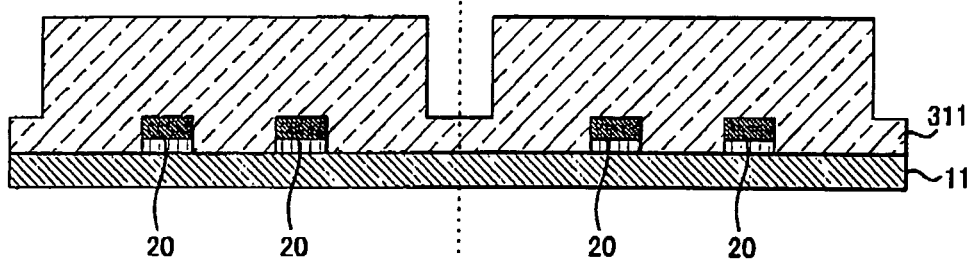

FIG. 25 is a schematic vertical cross sectional view for illustrating manufacturing processes in a first modification of the nineteenth embodiment.

In the nineteenth embodiment (see FIG. 24), the separate concave portion 341 is each provided for two LED elements 20. In other words, the concave portion 341 is formed in the sealing member 311 for each LED element 20.

On the other hand, in the first modification of the nineteenth embodiment, one concave portion 341 is provided for every two LED elements 20. In other words, the concave portion 341 for lumping each LED element 20 together is formed in the sealing member 311.

Figure 26A:
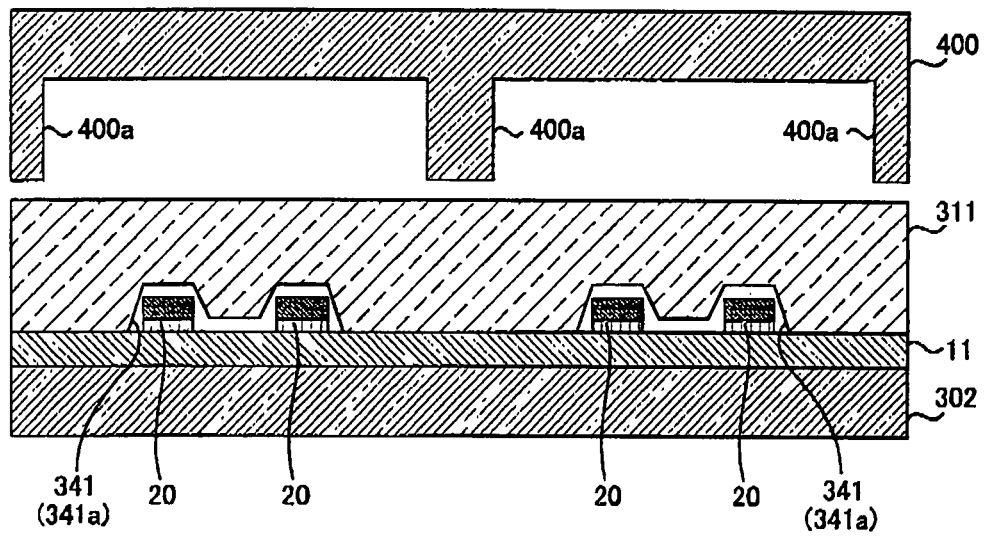
FIG. 26 is a schematic vertical cross sectional view for illustrating manufacturing processes in a second modification of the nineteenth embodiment.
Figure 26B:
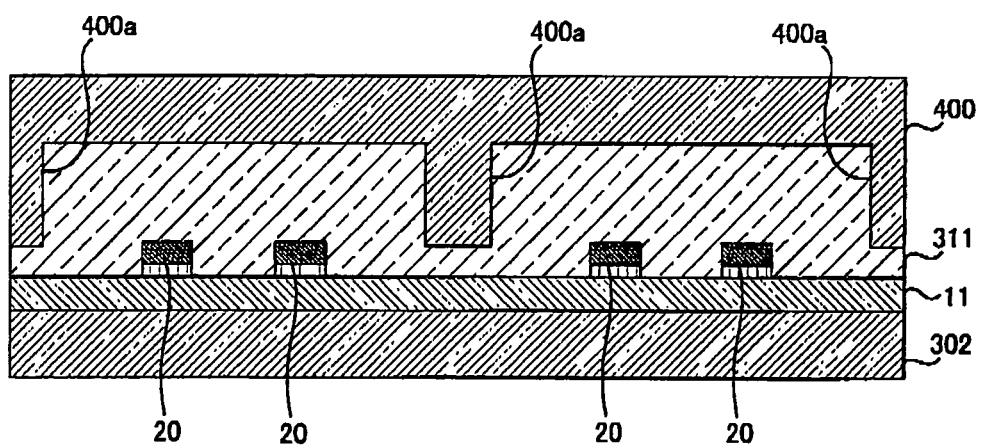
Figure 26C:
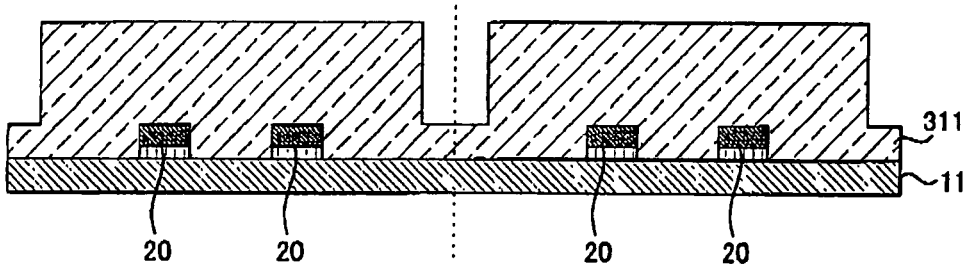

FIG. 26 is a schematic vertical cross sectional view for illustrating manufacturing processes in a second modification of the nineteenth embodiment, The second modification of the nineteenth embodiment is different from the first modification (see FIG. 25) in that the middle portion of the concave portion 341 between the LED elements 20 is narrow. In other words, the shape of concave portion 341 in the second modification of the nineteenth embodiment has an intermediate configuration between the nineteenth embodiment (see FIG. 24) and the first modification (see FIG. 25).

Although two LED elements 20 are sealed in one LED lamp in the nineteenth embodiment, three or more LED elements 20 may be sealed therein.

In addition, for the concave portion 341, the optimum size and shape may be experimentally found in accordance with the number of LED elements 20 housed in one concave portion 341 so that the above-mentioned effects of the first to eighteenth embodiments are surely obtained.

Twentieth Embodiment

FIG. 27 is a schematic vertical cross sectional view for explaining a twentieth embodiment.

Figure 27A:
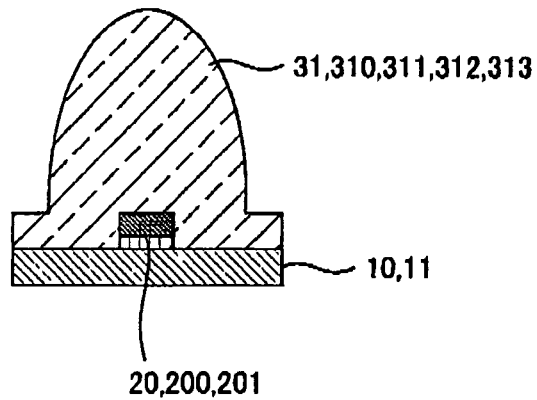
FIG. 27 is a schematic vertical cross sectional view for explaining a twentieth embodiment of the invention.

As shown in FIG. 27(A), it is possible to form a condenser lens by forming the sealing members 31, 310, 311, 312 and 313 in a bullet shape.

Figure 27B:
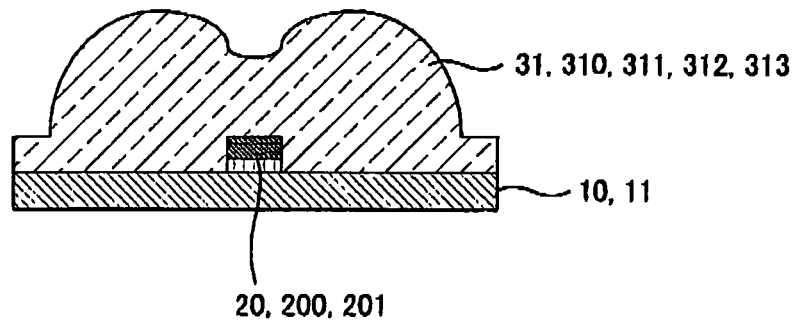

As shown in FIG. 27(B), it is possible to provide two convex lens shapes on the sealing members 31, 310, 311, 312 and 313.

Figure 27C:
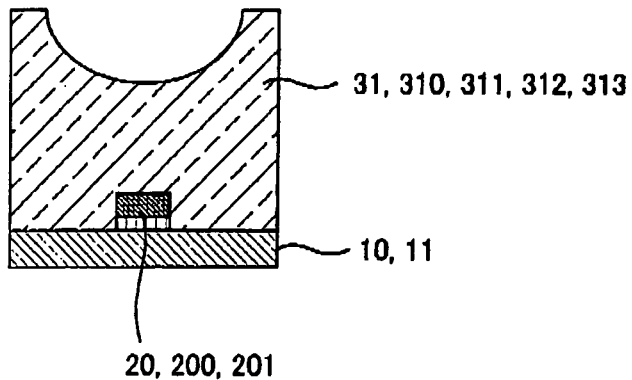

As shown in FIG. 27(C), it is possible to provide a concave lens shape on the sealing members 31, 310, 311, 312 and 313.

As described above, the shape of the upper die (sealing member forming die) may be appropriately determined corresponding to the aforementioned lens shapes in order to provide a desired shape on the sealing member.

The present invention is not limited to the descriptions of the above-mentioned each embodiment and example. The present invention also includes various modifications within a range readily apparent to one skilled in the art without departing from the scope of claims. All contents of the disclosures, the published unexamined patent applications and the patent gazettes and the like specified in the specification are incorporated herein by reference.

Although the invention has been described with respect to the specific embodiments for complete and clear disclosure, the appended claims are not to be therefore limited but are to be construed as embodying all modifications and alternative constructions that may occur to one skilled in the art which fairly fall within the basic teaching herein set forth.

What is claimed is:

1. A method of manufacturing an LED lamp, the method comprising:
    mounting an LED element on a substrate;
    preparing a glass sealing member that includes a concave portion to house the LED element; and
    sealing the LED element by the glass sealing member,
    wherein, in the sealing, the glass sealing member is arranged so that a forming surface of the concave portion faces the LED element, and the glass sealing member is bonded to the substrate by a thermal compression bonding such that the forming surface of the concave portion is made along the LED element so as to eliminate substantially a gap between the glass sealing member and the LED element, and
    wherein, in the sealing the glass sealing member, the thermal compression bonding is conducted at a temperature T (° C.) to meet an expression (1) below:

$$Tg < T \leq Ap + 30° C. \qquad (1)$$

where Tg (° C.) is a glass-transition temperature of the sealing member and Ap (° C.) is a yielding point temperature of the sealing member.

2. The method according to claim 1, wherein the LED element is flip-chip mounted or face-up mounted in the mounting.

3. The method according to claim 1, further comprising supplying phosphor to a vicinity of the LED element before the sealing.

4. The method according to claim 1, further comprising forming a reflective layer on a surface of the sealing member opposite to a substrate after the sealing.

5. The method according to claim 1, wherein, in the preparing of the glass sealing member, the forming surface of the concave portion comprises a substrate-facing surface that faces a side surface of the substrate, and
    wherein, in the sealing, the substrate-facing surface faces the side surface of the substrate when the forming surface of the concave portion faces the LED element, and the substrate-facing surface is along the side surface of the substrate when the glass sealing member is bonded on the substrate side by the thermal compression bonding.

6. The method according to claim 1, wherein a plurality of LED elements are mounted on one substrate in the mounting, and
    wherein the method further comprises separating the substrate after the mounting.

7. The method according to claim 6, wherein each of the separated substrates is set to one lower die in a state that the substrates are isolated from each other in the sealing.

8. The method according to claim 7, wherein each of the separated substrates is set to the lower die in a state that a spacer each intervenes therebetween in the sealing.

9. The method according to claim 7, wherein each of the separated substrates is set in a substrate housing portion formed on the lower die in the sealing; and
    wherein the substrate housing portion is each formed for every separated substrate.

10. The method according to claim 6, wherein the glass sealing member is provided with a main body comprising the concave portion and a basal portion bonded to the substrate by the thermal compression bonding, and comprises an integrated object in that the main body is integrated with the basal portion, and
    wherein the sealing member as the integrated object is set to a die.

11. The method according to claim 10, wherein an upper die for pressing the glass sealing member comprises a void portion at a portion thereof facing the basal portion of the glass sealing member.

12. The method according to claim 6, wherein the glass sealing member is provided with a main body comprising the concave portion and a basal portion bonded to the substrate by the thermal compression bonding, and
    wherein the glass sealing member is set to a die for each of the separated substrate in a state that the basal portion is isolated.

13. The method according to claim 1, wherein a plurality of the LED elements are mounted on the one substrate in the mounting,
    wherein the glass sealing member is provided with a main body comprising the concave portion and a basal portion bonded to the substrate by the theimal compression bonding, and
    wherein the sealing member is set to one die in a state that the basal portion is isolated.

14. The method according to claim 10, wherein the main body has a lens shape.

15. The method according to claim 1, wherein the glass sealing member is prevented from moving toward a surface direction of the substrate in the sealing.

16. A die used for the method according to claim 15, comprising a restricting device for preventing the sealing member from moving toward the surface direction.

17. The die according to claim 16, wherein the restricting device comprises a convex portion provided on an upper or lower die.

18. The die according to claim 17, wherein a plurality of the LED elements are set to the lower die, and
    wherein the convex portion is provided so as to surround each of the plurality of the LED elements.

19. The die according to claim 17, wherein a plurality of the LED elements are set to the lower die, and
    wherein the convex portion is provided along a peripheral edge of the upper or lower die.

20. The die according to claim 16, wherein a contact avoidance portion for avoiding contact with a tip portion of the convex portion is formed in the glass sealing member.

* * * * *